United States Patent
Zhou et al.

(10) Patent No.: US 12,094,550 B2
(45) Date of Patent: Sep. 17, 2024

(54) FAST SEARCH FOR LEAKY WORD LINE

(71) Applicant: Western Digital Technologies, Inc., San Jose, CA (US)

(72) Inventors: Xingyan Zhou, Shanghai (CN); Liang Li, Shanghai (CN); Zhen Qin, Shanghai (CN); William Mak, San Jose, CA (US); Yan Li, Milpitas, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 303 days.

(21) Appl. No.: 17/886,163

(22) Filed: Aug. 11, 2022

(65) Prior Publication Data

US 2024/0055064 A1   Feb. 15, 2024

(51) Int. Cl.
| | |
|---|---|
| *G11C 29/12* | (2006.01) |
| *G11C 16/04* | (2006.01) |
| *G11C 16/08* | (2006.01) |
| *G11C 16/10* | (2006.01) |
| *G11C 16/16* | (2006.01) |

(Continued)

(52) U.S. Cl.
CPC .... *G11C 29/12005* (2013.01); *G11C 16/0483* (2013.01); *G11C 16/08* (2013.01); *G11C 16/10* (2013.01); *G11C 16/16* (2013.01); *G11C 16/3459* (2013.01); *G11C 2029/1202* (2013.01); *H01L 25/0657* (2013.01); *H01L 2225/06562* (2013.01)

(58) Field of Classification Search
CPC .......... G11C 29/12005; G11C 16/0483; G11C 16/08; G11C 16/10; G11C 16/16; G11C 16/3459; G11C 2029/1202
See application file for complete search history.

(56) References Cited

U.S. PATENT DOCUMENTS

| | | |
|---|---|---|
| 5,428,621 A | 6/1995 | Mehrotra et al. |
| 8,379,454 B2 | 2/2013 | Kochar et al. |
| 8,432,732 B2 | 4/2013 | Li et al. |

(Continued)

FOREIGN PATENT DOCUMENTS

| | | |
|---|---|---|
| KR | 20200035528 A | 4/2020 |
| KR | 20210004218 A | 1/2021 |

(Continued)

OTHER PUBLICATIONS

U.S. Appl. No. 17/886,155, filed Aug. 11, 2022.

*Primary Examiner* — Han Yang
(74) *Attorney, Agent, or Firm* — Vierra Magen Marcus LLP

(57) ABSTRACT

Technology is disclosed herein for detecting leaky word lines in a non-volatile storage system. The exact leaky word line may be located very rapidly using a divide and conquer approach. First a determination may be made whether at least one word line in a group such as any of the word lines in a block is leaky. This initial determination can be made very quickly. If no word line in the group is leaky, the search can end. However, responsive to a determination that at least one word line in the group is leaky, a divide and conquer search may be performed in which the group of the word lines is repeatedly divided into smaller sub-groups with selected smaller sub-groups tested for a short circuit until the leaky word line is located.

20 Claims, 24 Drawing Sheets

(51) Int. Cl.
    *G11C 16/34*       (2006.01)
    *H01L 25/065*      (2023.01)

(56) References Cited

U.S. PATENT DOCUMENTS

| | | |
|---|---|---|
| 9,224,502 B1 | 12/2015 | Sabde et al. |
| 9,330,783 B1 | 5/2016 | Rotbard et al. |
| 9,361,991 B1 | 6/2016 | Ng et al. |
| 9,449,694 B2 | 9/2016 | Paudel et al. |
| 9,529,663 B1 | 12/2016 | Srinivasan et al. |
| 9,934,872 B2 | 4/2018 | Magia et al. |
| 10,008,276 B2 | 6/2018 | Huynh et al. |
| 10,297,329 B2 | 5/2019 | Rabkin et al. |
| 10,770,165 B1 | 9/2020 | Cai et al. |
| 2012/0275228 A1* | 11/2012 | Lu ................ G11C 29/025 365/185.18 |
| 2015/0085575 A1 | 3/2015 | Tam |
| 2015/0179275 A1 | 6/2015 | Patel et al. |
| 2016/0260495 A1* | 9/2016 | Paudel ............. G11C 16/26 |
| 2021/0152190 A1 | 5/2021 | Dodds |
| 2021/0398604 A1 | 12/2021 | Li et al. |
| 2022/0093181 A1 | 3/2022 | Komatsu et al. |

FOREIGN PATENT DOCUMENTS

| KR | 20210077800 A | 6/2021 |
|---|---|---|
| KR | 20220030189 A | 3/2022 |

\* cited by examiner

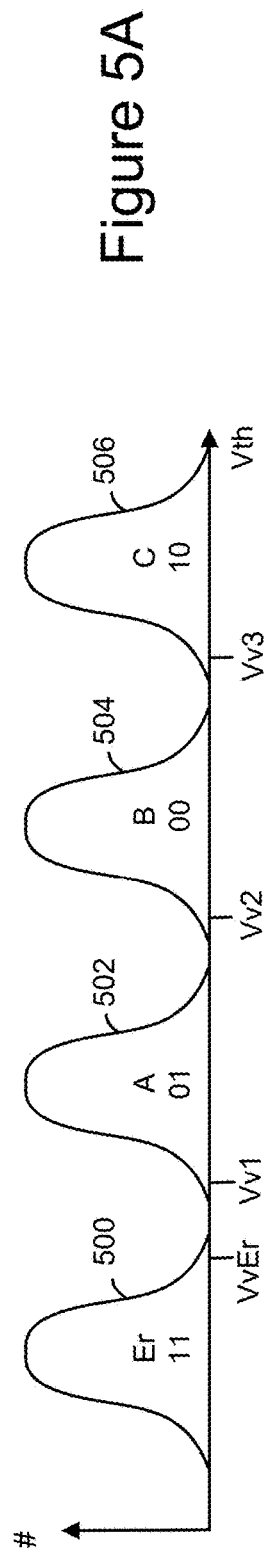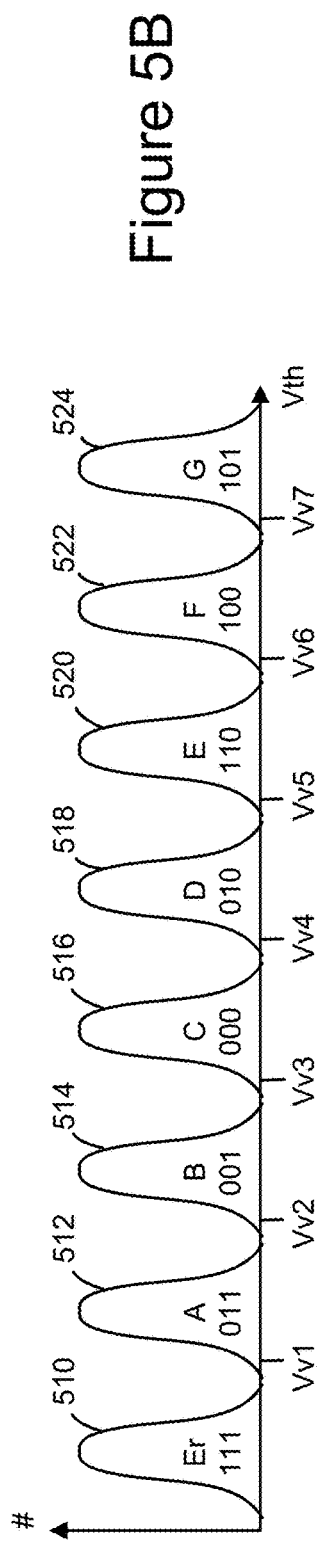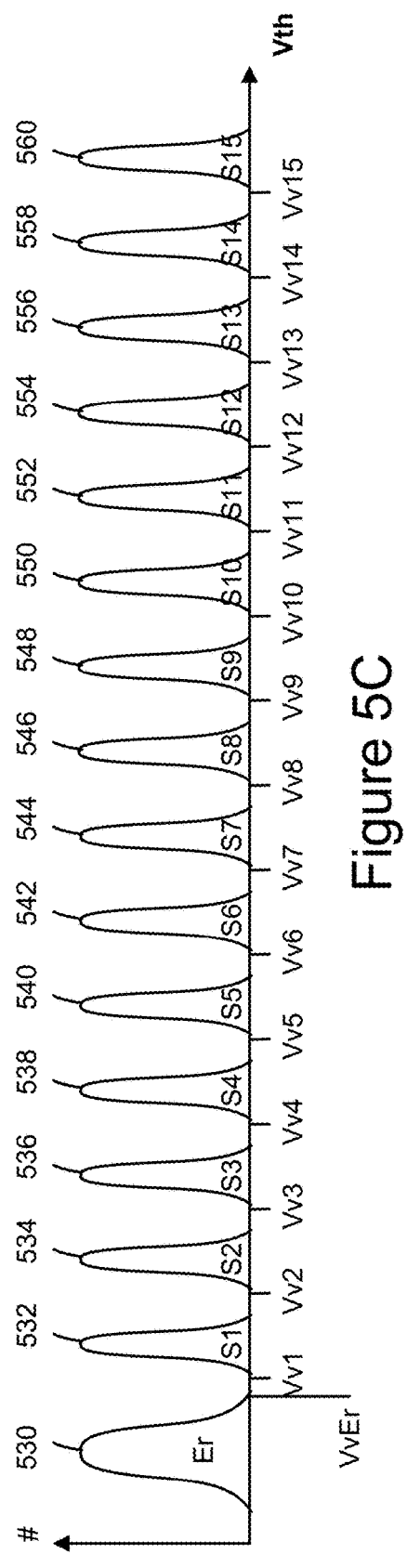

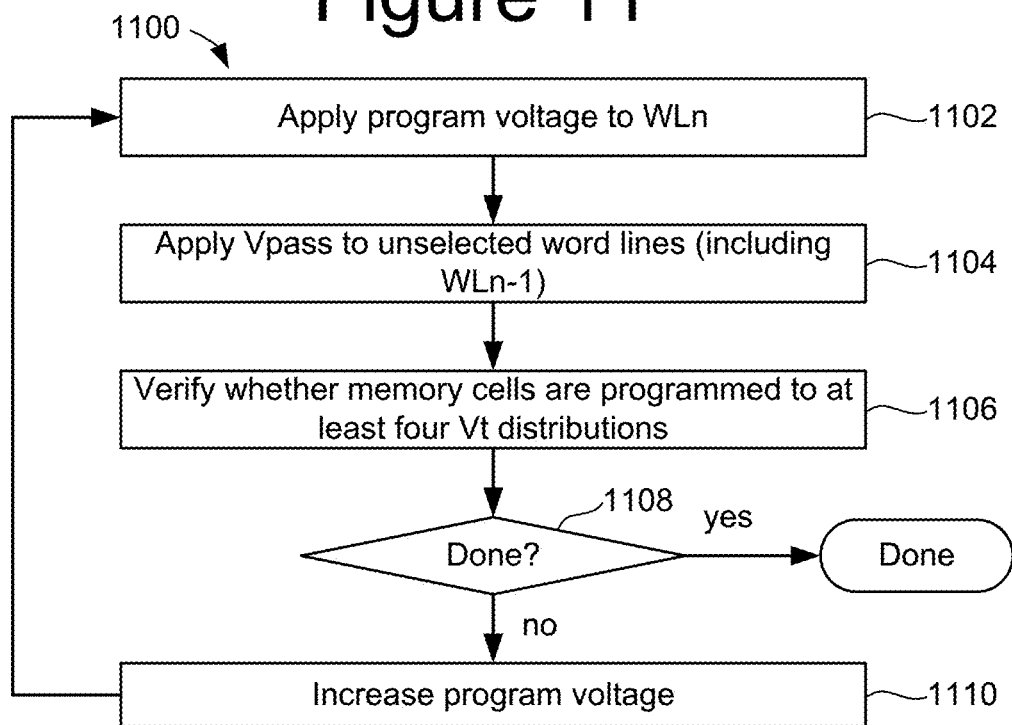
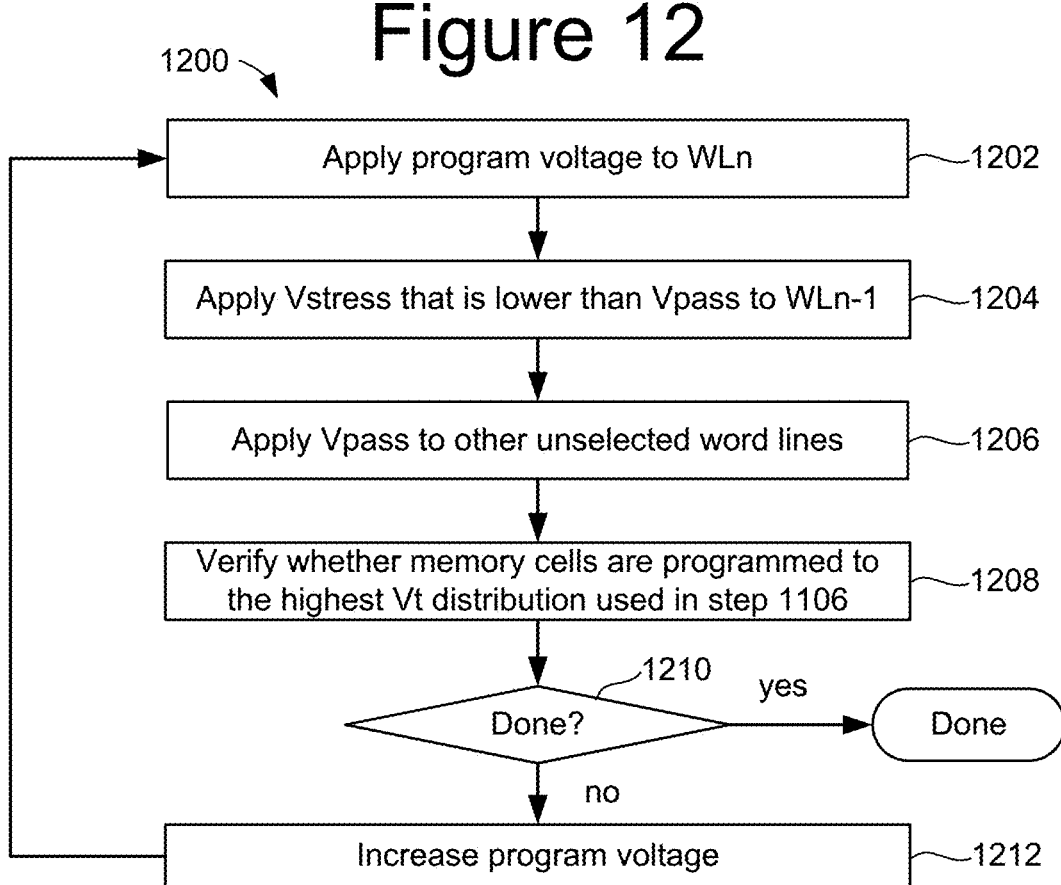

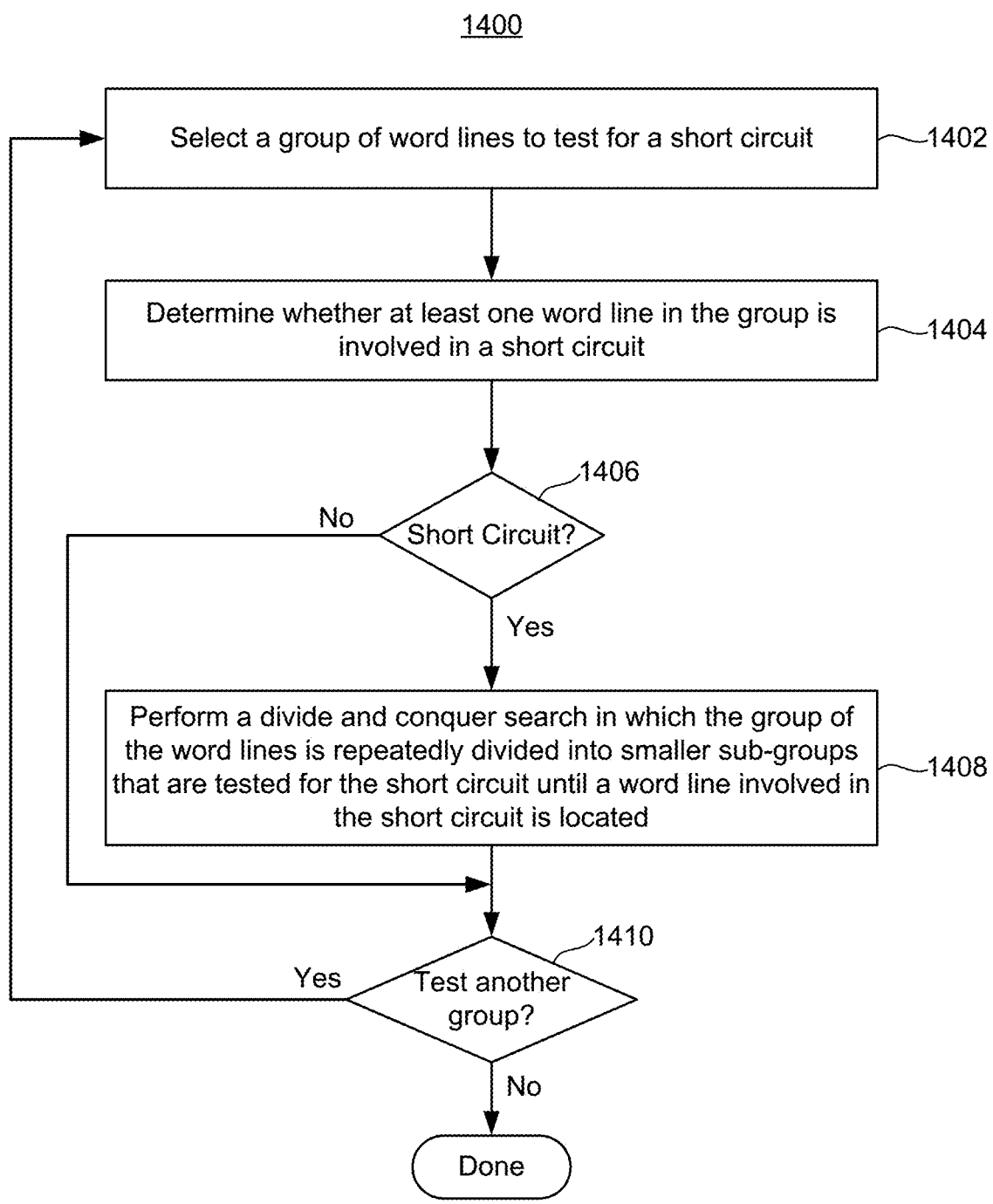

| BL | VSS (0V) |
|---|---|
| SGD | Vsgd |
| DD | Vpass |
| WL81 to WL161 | Vpgmu |
| WLIFDU | Vpass |
| WLIFDL | Vpass |
| WL0 to WL80 | Vpgmu |
| DS | Vpass |
| SGS | Vsgs |
| SL | VSS (0V) |

Figure 18A

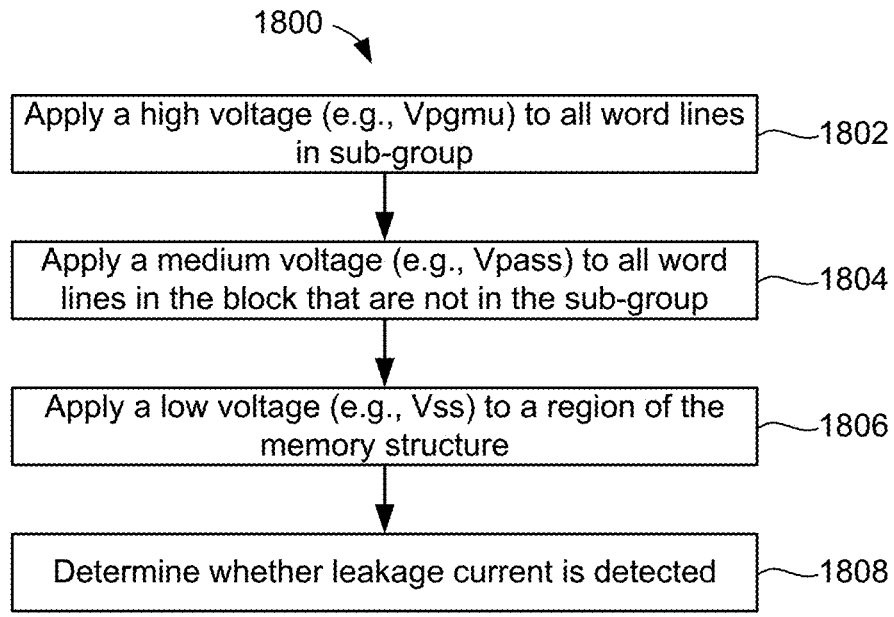

1800

- Apply a high voltage (e.g., Vpgmu) to all word lines in sub-group — 1802
- Apply a medium voltage (e.g., Vpass) to all word lines in the block that are not in the sub-group — 1804
- Apply a low voltage (e.g., Vss) to a region of the memory structure — 1806
- Determine whether leakage current is detected — 1808

Figure 18B

| | |
|---|---|
| BL | VSS (0V) |
| SGD | Vsgd |
| DD | Vpass |
| WLn+1 to WL161 | Vpass |
| WLn | Vpgmu |
| WL81 to WLn | Vpass |
| WLIFDU | Vpass |
| WLIFDL | Vpass |
| WL0 to WL80 | Vpass |
| DS | Vpass |
| SGS | Vsgs |
| SL | VSS (0V) |

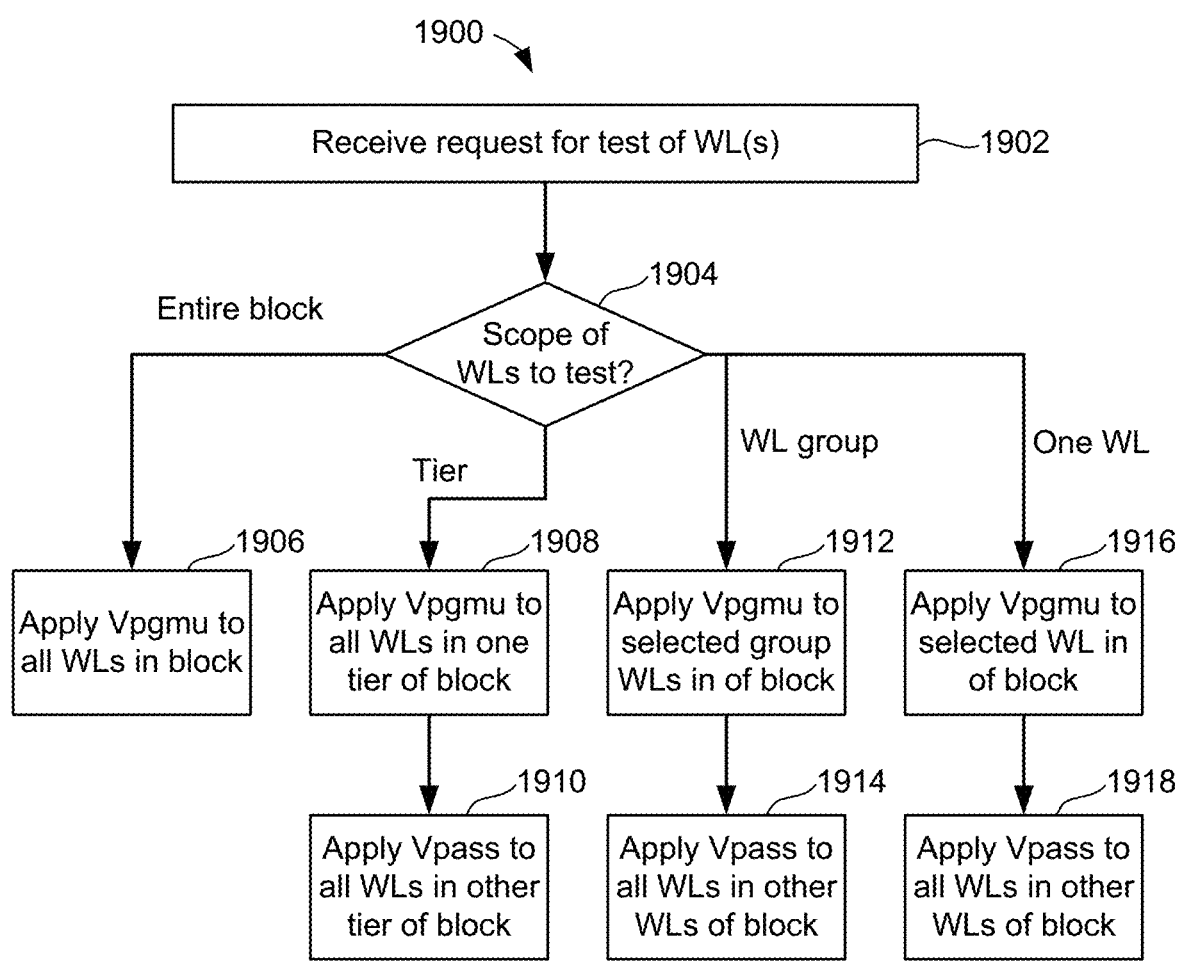

FAST SEARCH FOR LEAKY WORD LINE

BACKGROUND

The present disclosure relates to non-volatile memory.

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. Non-volatile memory allows information to be stored and retained even when the non-volatile memory is not connected to a source of power (e.g., a battery).

A memory structure in the memory system typically contains many memory cells and various control lines. The memory structure may be three-dimensional. One type of three-dimensional structure has non-volatile memory cells arranged as vertical NAND strings. The memory structure may be arranged into units that are commonly referred to as blocks. For example, a block in a NAND memory system contains many NAND strings. A NAND string contains memory cell transistors connected in series, a drain side select gate at one end, and a source side select gate at the other end. Each NAND string is associated with a bit line. The block typically has many word lines that provide voltages to the control gates of the memory cell transistors. In some architectures, each word line connects to the control gate of one memory cell on each respective NAND string in the block.

The non-volatile memory cells may be programmed to store data. Typically, the memory cells are programmed to a number of data states. Using two data states to store a single bit per cell is referred to herein as SLC programming. Using a greater number of data states allows for more bits to be stored per memory cell. Using additional data states to store two or more bits per cell is referred to herein as MLC programming. For example, four data states may be used to store two bits per memory cell, eight data states may be used in order to store three bits per memory cell, 16 data states may be used to store four bits per memory cell, etc. Some memory cells may be programmed to a data state by storing charge in the memory cell. For example, the threshold voltage (Vt) of a NAND memory cell can be set to a target Vt by programming charge into a charge storage region such as a charge trapping layer. The amount of charge stored in the charge trapping layer establishes the Vt of the memory cell.

During a program operation a series of program voltage pulses are applied to the control gates of the memory cells. Each voltage pulse may be stepped up in magnitude from a previous program pulse by a step size in a processed referred to as incremental step pulse programming. Each program voltage may be followed by a verify operation to determine if the respective memory cells have been programmed to the desired memory state. Thus, the program operation may include a number of program/verify loops. The word line that is connected to the memory cells being verified is referred to herein as the "selected word line." The remaining word lines connected to other memory cells on the NAND strings are referred to herein as "unselected word lines."

Following manufacturing defects may exist in the memory structure. For example, there could be a short circuit between a word line and a NAND string. There could be a short circuit between a word line and conductive line such as a source line. Such defects can result in dysfunction of memory operations such as erase, program, and/or read. Such defects can potentially result in data loss. Therefore, the memory structure is typically tested after manufacture to detect such defects. Regions of the memory structure having a defect may be retired. For example, a block of memory cells that contains a defect may be marked as a bad block such that it is not used in the field.

Normal memory operations in the field create a small amount of stress on the memory structure. Over time it is possible that the cumulative stress from many memory operations can create a defect. Herein the term "grown bad block" refers to a block of memory cells that develop a defect in the field. Some memory systems will test for and retire grown bad blocks. For example, some systems may test for defects during a program operation. However, testing for defects during a program operation may impact performance.

BRIEF DESCRIPTION OF THE DRAWINGS

Like-numbered elements refer to common components in the different figures.

FIGS. 5A, 5B and 5C depict threshold voltage distributions.

FIG. 11 is a flowchart of one embodiment of a process of normal programming.

FIG. 12 is a flowchart of one embodiment of a process of programming during a stress test.

FIG. 14 is a flowchart of one embodiment of a process for locating a leaky word line.

FIG. 18A is a flowchart of one embodiment of a process of determining whether a sub-group of word lines contains a leaky word line.

FIG. 18B is a table that provides further details of voltages applied during an embodiment of the process of FIG. 18A.

FIG. 19 is a flowchart of one embodiment of a process of performing a leaky word line test in a specific set of word lines.

DETAILED DESCRIPTION

Figure 1:
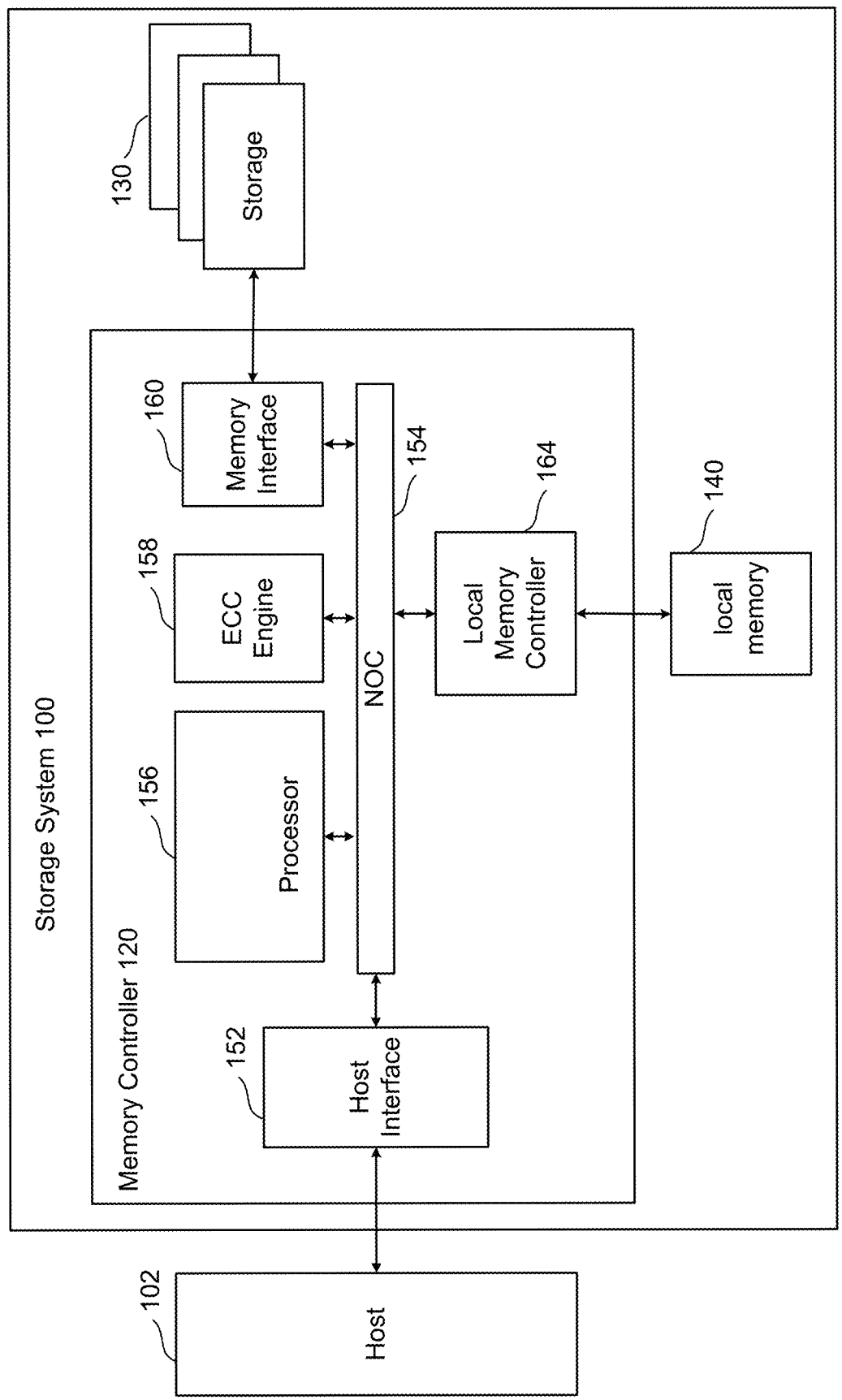
FIG. 1 is a block diagram depicting one embodiment of a storage system.

Technology is disclosed herein for detecting short circuits involving word lines in a non-volatile storage system. A word line that is involved in a short circuit (or more briefly "short") is referred to herein as a "leaky word line," which refers to current leakage that occurs as a result of the short circuit. The short circuit may include, but is not limited to, a word line to NAND channel short, a word line to conductive line short, and/or a word line to source line short. The leaky word line may be detected during a built-in self-test (BIST). For example, electronic circuitry within the memory system may test for and locate the leaky word line.

In an embodiment, the exact word line that is involved in the short is located very rapidly using a divide and conquer approach. In an embodiment, first a determination is made whether at least one word line in a group such as any of the word lines in a block is involved in a short circuit. This initial determination can be made very quickly. If no word line in the group is involved with a short, the search can end. However, responsive to a determination that at least one word line in the group is involved in a short circuit, a divide and conquer search may be performed in which the group of the word lines is repeatedly divided into smaller sub-groups with selected smaller sub-groups tested for a short circuit until the word line involved in the short circuit is located.

Determining the exact word line that is leaky provides feedback that can be used to improve the design and fabrication of future memory systems. For example, if it is determined that word lines located in a specific region of a block are more likely to fail, changes can be made in the design and/or fabrication to improve such word lines. Also, operational changes can be made to account for certain word lines being more likely to become leaky word lines in the field.

Technology is disclosed herein for detecting grown bad blocks in a non-volatile storage system. In an embodiment, a stress test is performed on a group of memory cells. The stress test may accelerate stressful conditions on the memory cells and thereby provide for early detection of grown bad blocks. Moreover, the number of grown bad blocks that escape detection is kept low. In an embodiment, the stress test involves generating an electric field (e-field) near a junction between word lines and a NAND string. The grown bad blocks may be detected in during a built-in self-test (BIST). For example, electronic circuitry within a memory system may test for and locate grown bad blocks.

In an embodiment, the stress test includes applying a program voltage to a selected word line and a stress voltage that is less than a nominal boosting voltage to a word line adjacent one side of the selected word line. The combination of the program voltage and the stress voltage may generate an e-field that is stronger than an e-field that would be generated in a normal program operation, thereby accelerating the stress on the memory cells. In an embodiment, the stress test further includes programming all of the memory cells to a relatively high threshold voltage, which may create additional stress on the memory cells.

FIG. 1 is a block diagram of one embodiment of a storage system 100 that implements the technology described herein. In one embodiment, storage system 100 is a solid state drive ("SSD"). Storage system 100 can also be a memory card, USB drive or other type of storage system. The proposed technology is not limited to any one type of storage system. Storage system 100 is connected to host 102, which can be a computer, server, electronic device (e.g., smart phone, tablet or other mobile device), appliance, or another apparatus that uses memory and has data processing capabilities. In some embodiments, host 102 is separate from, but connected to, storage system 100. In other embodiments, storage system 100 is embedded within host 102.

The components of storage system 100 depicted in FIG. 1 are electrical circuits. Storage system 100 includes a memory controller 120 (or storage controller) connected to non-volatile storage 130 and local high speed memory 140 (e.g., DRAM, SRAM, MRAM). Local memory 140 is non-transitory memory, which may include volatile memory or non-volatile memory. Local high speed memory 140 is used by memory controller 120 to perform certain operations. For example, local high speed memory 140 may store logical to physical address translation tables ("L2P tables").

Memory controller 120 comprises a host interface 152 that is connected to and in communication with host 102. In one embodiment, host interface 152 implements an NVM Express (NVMe) over PCI Express (PCIe). Other interfaces can also be used, such as SCSI, SATA, etc. Host interface 152 is also connected to a network-on-chip (NOC) 154. A NOC is a communication subsystem on an integrated circuit. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). In other embodiments, NOC 154 can be replaced by a bus. Connected to and in communication with NOC 154 is processor 156, ECC engine 158, memory interface 160, and local memory controller 164. Local memory controller 164 is used to operate and communicate with local high speed memory 140 (e.g., DRAM, SRAM, MRAM).

ECC engine 158 performs error correction services. For example, ECC engine 158 performs data encoding and decoding. In one embodiment, ECC engine 158 is an electrical circuit programmed by software. For example, ECC engine 158 can be a processor that can be programmed. In other embodiments, ECC engine 158 is a custom and dedicated hardware circuit without any software. In another embodiment, the function of ECC engine 158 is implemented by processor 156.

Processor 156 performs the various controller memory operations, such as programming, erasing, reading, and memory management processes. In one embodiment, processor 156 is programmed by firmware. In other embodiments, processor 156 is a custom and dedicated hardware circuit without any software. Processor 156 also implements a translation module, as a software/firmware process or as a dedicated hardware circuit. In many systems, the non-volatile memory is addressed internally to the storage system using physical addresses associated with the one or more memory die. However, the host system will use logical addresses to address the various memory locations. This enables the host to assign data to consecutive logical addresses, while the storage system is free to store the data as it wishes among the locations of the one or more memory die. To implement this system, memory controller 120 (e.g., the translation module) performs address translation between the logical addresses used by the host and the physical addresses used by the memory die. One example implementation is to maintain tables (i.e. the L2P tables mentioned above) that identify the current translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure. In some examples, the memory space of a storage system is so large that the local memory 140 cannot hold all of the L2P tables. In such a case, the entire set of L2P tables are stored in a storage 130 and a subset of the L2P tables are cached (L2P cache) in the local high speed memory 140.

Memory interface 160 communicates with non-volatile storage 130. In one embodiment, memory interface provides a Toggle Mode interface. Other interfaces can also be used. In some example implementations, memory interface 160 (or another portion of controller 120) implements a scheduler and buffer for transmitting data to and receiving data from one or more memory die.

Figure 2A:
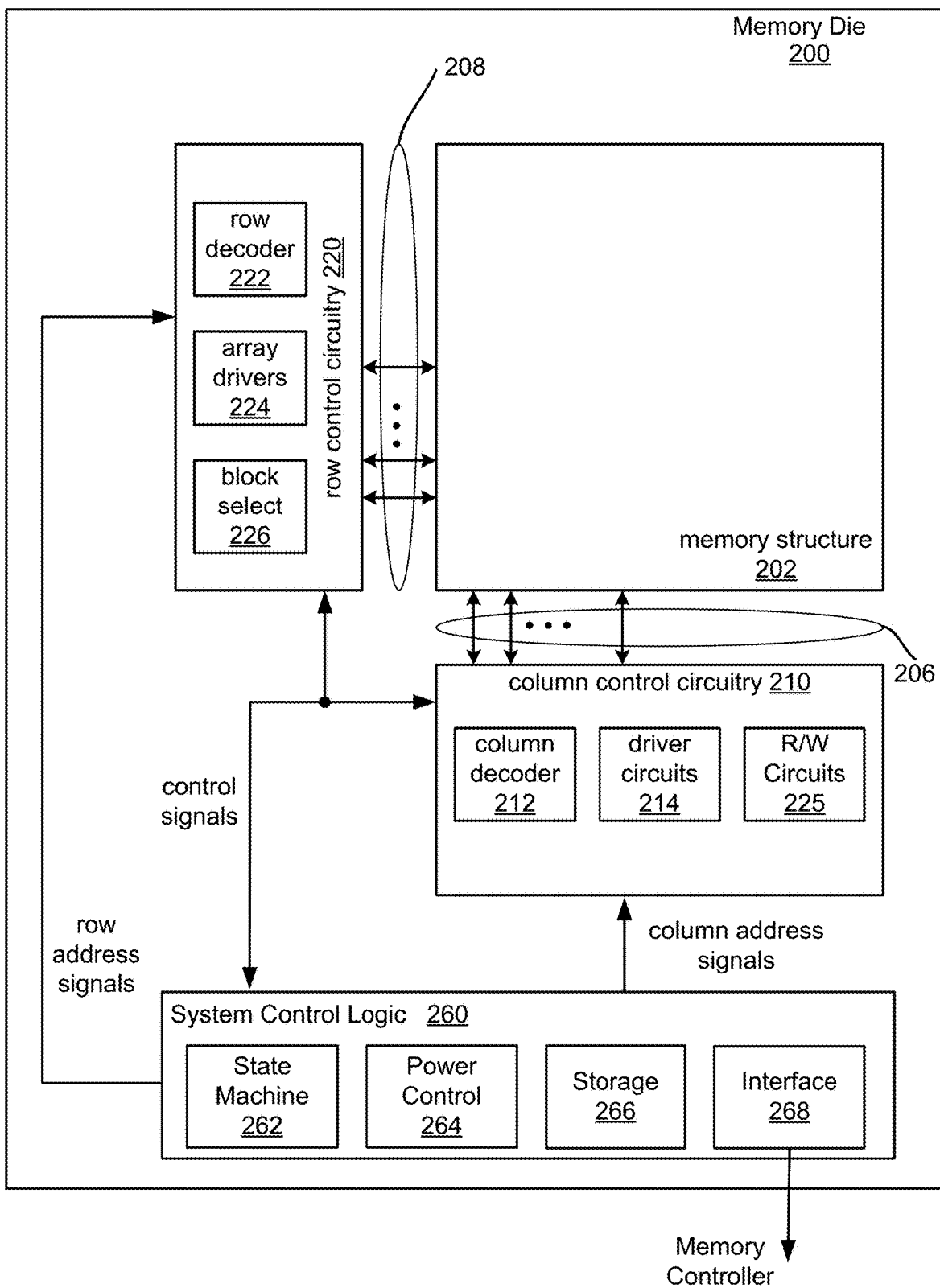
FIG. 2A is a block diagram of one embodiment of a memory die.

In one embodiment, non-volatile storage 130 comprises one or more memory dies. FIG. 2A is a functional block diagram of one embodiment of a memory die 200 that comprises non-volatile storage 130. Each of the one or more memory dies of non-volatile storage 130 can be implemented as memory die 200 of FIG. 2A. The components depicted in FIG. 2A are electrical circuits. Memory die 200 includes a memory structure 202 (e.g., memory array) that can comprise non-volatile memory cells (also referred to as non-volatile storage cells), as described in more detail below. The array terminal lines of memory structure 202 include the various layer(s) of word lines organized as rows, and the various layer(s) of bit lines organized as columns. However, other orientations can also be implemented. Memory die 200 includes row control circuitry 220, whose outputs are connected to respective word lines of the memory structure 202. Row control circuitry 220 receives a group of M row address signals and one or more various control signals from System Control Logic circuit 260, and typically may include such circuits as row decoders 222, array drivers 224, and block select circuitry 226 for both reading and writing (programming) operations. Row control circuitry 220 may also include read/write circuitry. Memory die 200 also includes column control circuitry 210 including read/write circuits 225. The read/write circuits 225 may contain sense amplifiers and data latches. The sense amplifier(s) input/outputs are connected to respective bit lines of the memory structure 202. Although only a single block is shown for structure 202, a memory die can include multiple arrays that can be individually accessed. Column control circuitry 210 receives a group of N column address signals and one or more various control signals from System Control Logic 260, and typically may include such circuits as column decoders 212, array terminal receivers or driver circuits 214, as well as read/write circuitry 225, and I/O multiplexers.

System control logic 260 receives data and commands from memory controller 120 and provides output data and status to the host. In some embodiments, the system control logic 260 (which comprises one or more electrical circuits) includes state machine 262 that provides die-level control of memory operations. In one embodiment, the state machine 262 is programmable by software. In other embodiments, the state machine 262 does not use software and is completely implemented in hardware (e.g., electrical circuits). In another embodiment, the state machine 262 is replaced by a micro-controller or microprocessor, either on or off the memory chip. System control logic 260 can also include a power control module 264 that controls the power and voltages supplied to the rows and columns of the memory structure 202 during memory operations. System control logic 260 includes storage 266 (e.g., RAM, registers, latches, etc.), which may be used to store parameters for operating the memory structure 202.

Commands and data are transferred between memory controller 120 and memory die 200 via memory controller interface 268 (also referred to as a "communication interface"). Memory controller interface 268 is an electrical interface for communicating with memory controller 120. Examples of memory controller interface 268 include a Toggle Mode Interface and an Open NAND Flash Interface (ONFI). Other I/O interfaces can also be used.

In some embodiments, all the elements of memory die 200, including the system control logic 260, can be formed as part of a single die. In other embodiments, some or all of the system control logic 260 can be formed on a different die than the die that contains the memory structure 202.

In one embodiment, memory structure 202 comprises a three-dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping layers.

In another embodiment, memory structure 202 comprises a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 202 is not limited to the examples above. Many different types of memory array architectures or memory technologies can be used to form memory structure 202. No particular non-volatile memory technology is required for purposes of the new claimed embodiments proposed herein. Other examples of suitable technologies for memory cells of the memory structure 202 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 202 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created. MRAM based memory embodiments will be discussed in more detail below.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of current, voltage, light, or other wave. These memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 2A can be grouped into two parts: (1) memory structure 202 and (2) peripheral circuitry, which includes all of the other components depicted in FIG. 2A. An important characteristic of a memory circuit is its capacity, which can be increased by increasing the area of the memory die of storage system 100 that is given over to the memory structure 202; however, this reduces the area of the memory die available for the peripheral circuitry. This can place quite severe restrictions on these elements of the peripheral circuitry. For example, the need to fit sense amplifier circuits within the available area can be a significant restriction on sense amplifier design architectures. With respect to the system control logic 260, reduced availability of area can limit the available functionalities that can be implemented on-chip. Consequently, a basic trade-off in the design of a memory die for the storage system 100 is the amount of area to devote to the memory structure 202 and the amount of area to devote to the peripheral circuitry.

Another area in which the memory structure 202 and the peripheral circuitry are often at odds is in the processing involved in forming these regions, since these regions often involve differing processing technologies and the trade-off in having differing technologies on a single die. For example, when the memory structure 202 is NAND flash, this is an NMOS structure, while the peripheral circuitry is often CMOS based. For example, elements such sense amplifier circuits, charge pumps, logic elements in a state machine, and other peripheral circuitry in system control logic 260 often employ PMOS devices. Processing operations for manufacturing a CMOS die will differ in many aspects from the processing operations optimized for an NMOS flash NAND memory or other memory cell technologies. Three-dimensional NAND structures (see, for example, FIG. 4) in particular may benefit from specialized processing operations.

To improve upon these limitations, embodiments described below can separate the elements of FIG. 2A onto separately formed dies that are then bonded together. More specifically, the memory structure 202 can be formed on one die (referred to as the memory die) and some or all of the peripheral circuitry elements, including one or more control circuits, can be formed on a separate die (referred to as the control die). For example, a memory die can be formed of just the memory elements, such as the array of memory cells of flash NAND memory, MRAM memory, PCM memory, ReRAM memory, or other memory type. Some or all of the peripheral circuitry, even including elements such as decoders and sense amplifiers, can then be moved on to a separate control die. This allows each of the memory die to be optimized individually according to its technology. For example, a NAND memory die can be optimized for an NMOS based memory array structure, without worrying about the CMOS elements that have now been moved onto a control die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other die. Although the following will focus on a bonded memory circuit of one memory die and one control die, other embodiments can use more dies, such as two memory dies and one control die, for example.

Figure 2B:
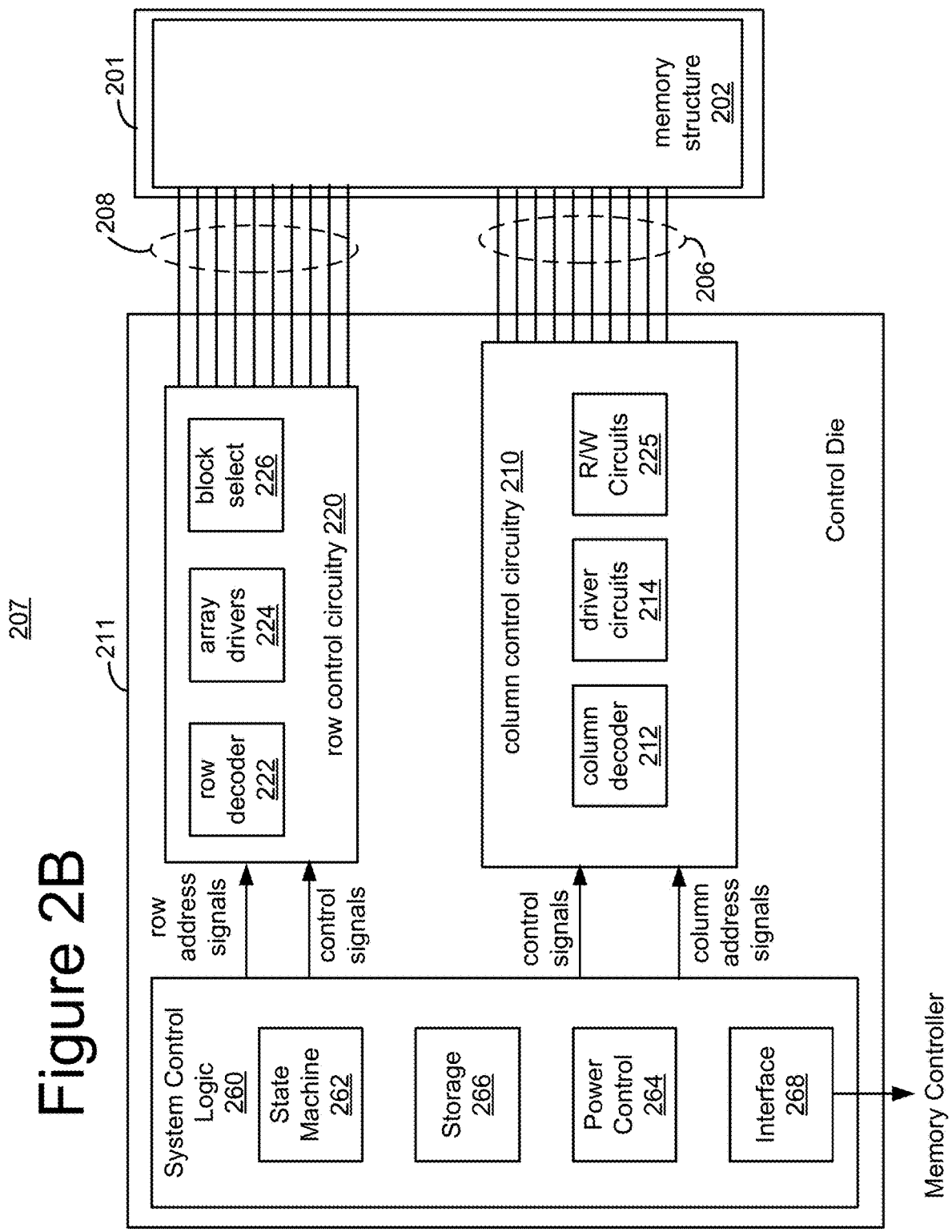
FIG. 2B is a block diagram of one embodiment of an integrated memory assembly.

FIG. 2B shows an alternative arrangement to that of FIG. 2A which may be implemented using wafer-to-wafer bonding to provide a bonded die pair. FIG. 2B depicts a functional block diagram of one embodiment of an integrated memory assembly 207. One or more integrated memory assemblies 207 may be used to implement the non-volatile storage 130 of storage system 100. The integrated memory assembly 207 includes two types of semiconductor dies (or more succinctly, "die"). Memory structure die 201 includes memory structure 202. Memory structure 202 includes non-volatile memory cells. Control die 211 includes control circuitry 260, 210, and 220 (as described above). In some embodiments, control die 211 is configured to connect to the memory structure 202 in the memory structure die 201. In some embodiments, the memory structure die 201 and the control die 211 are bonded together.

FIG. 2B shows an example of the peripheral circuitry, including control circuits, formed in a peripheral circuit or control die 211 coupled to memory structure 202 formed in memory structure die 201. Common components are labelled similarly to FIG. 2A. System control logic 260, row control circuitry 220, and column control circuitry 210 are located in control die 211. In some embodiments, all or a portion of the column control circuitry 210 and all or a portion of the row control circuitry 220 are located on the memory structure die 201. In some embodiments, some of the circuitry in the system control logic 260 is located on the on the memory structure die 201.

System control logic 260, row control circuitry 220, and column control circuitry 210 may be formed by a common process (e.g., CMOS process), so that adding elements and functionalities, such as ECC, more typically found on a memory controller 120 may require few or no additional process steps (i.e., the same process steps used to fabricate controller 120 may also be used to fabricate system control logic 260, row control circuitry 220, and column control circuitry 210). Thus, while moving such circuits from a die such as memory structure die 201 may reduce the number of steps needed to fabricate such a die, adding such circuits to a die such as control die 211 may not require many additional process steps. The control die 211 could also be referred to as a CMOS die, due to the use of CMOS technology to implement some or all of control circuitry 260, 210, 220.

FIG. 2B shows column control circuitry 210 including read/write circuits 225 on the control die 211 coupled to memory structure 202 on the memory structure die 201 through electrical paths 206. For example, electrical paths 206 may provide electrical connection between column decoder 212, driver circuitry 214, and R/W circuits 225 and bit lines of memory structure 202. Electrical paths may extend from column control circuitry 210 in control die 211 through pads on control die 211 that are bonded to corresponding pads of the memory structure die 201, which are connected to bit lines of memory structure 202. Each bit line of memory structure 202 may have a corresponding electrical path in electrical paths 206, including a pair of bond pads, which connects to column control circuitry 210. Similarly, row control circuitry 220, including row decoder 222, array drivers 224, and block select 226 are coupled to memory structure 202 through electrical paths 208. Each electrical path 208 may correspond to a word line, dummy word line, or select gate line. Additional electrical paths may also be provided between control die 211 and memory structure die 201.

For purposes of this document, the phrases "a control circuit" or "one or more control circuits" can include any one of or any combination of memory controller 120, state machine 262, power control 264, all or a portion of system control logic 260, all or a portion of row control circuitry 220, all or a portion of column control circuitry 210, read/write circuits 225, sense amps, a microcontroller, a microprocessor, and/or other similar functioned circuits. A control circuit can include hardware only or a combination of hardware and software (including firmware). For example, a controller programmed by firmware to perform the functions described herein is one example of a control circuit. A control circuit can include a processor, FPGA, ASIC, integrated circuit, or other type of circuit.

For purposes of this document, the term "apparatus" can include, but is not limited to, one or more of, storage system 100, memory controller 120, storage 130, memory die 200, integrated memory assembly 207, and/or control die 211.

Figure 3A:
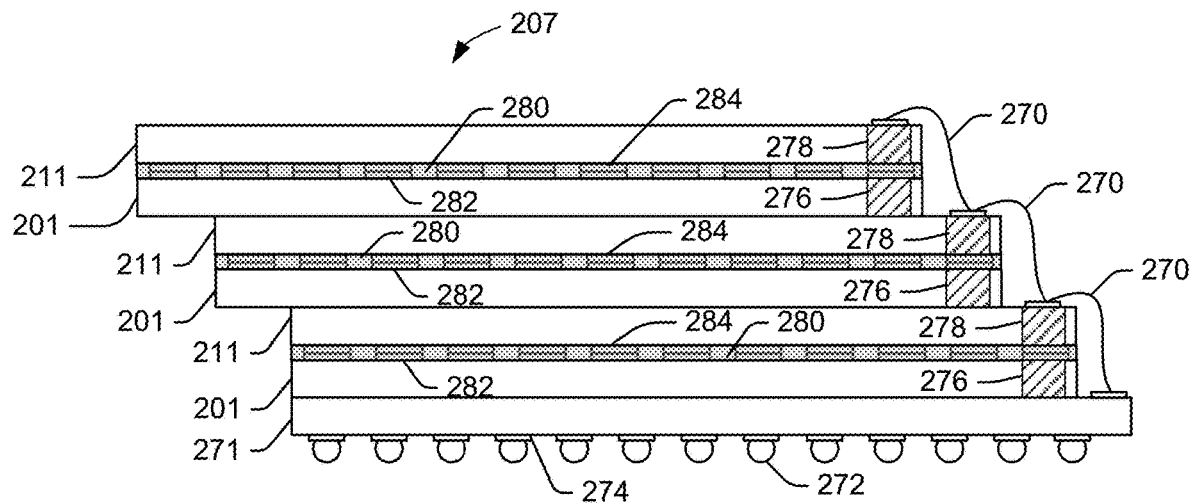
FIGS. 3A and 3B depict different embodiments of integrated memory assemblies.

In some embodiments, there is more than one control die 211 and more than one memory structure die 201 in an integrated memory assembly 207. In some embodiments, the integrated memory assembly 207 includes a stack of multiple control dies 211 and multiple memory structure dies 201. FIG. 3A depicts a side view of an embodiment of an integrated memory assembly 207 stacked on a substrate 271 (e.g., a stack comprising control die 211 and memory structure die). The integrated memory assembly 207 has three control dies 211 and three memory structure dies 201. In some embodiments, there are more than three memory structure dies 201 and more than three control dies 211. In FIG. 3A there are an equal number of memory structure dies 201 and control dies 211; however, in one embodiment, there are more memory structure dies 201 than control dies 211. For example, one control die 211 could control multiple memory structure dies 201.

Each control die 211 is affixed (e.g., bonded) to at least one of the memory structure die 201. Some of the bond pads 282/284 are depicted. There may be many more bond pads. A space between two die 201, 211 that are bonded together is filled with a solid layer 280, which may be formed from epoxy or other resin or polymer. This solid layer 280 protects the electrical connections between the die 201, 211, and further secures the die together. Various materials may be used as solid layer 280, but in embodiments, it may be Hysol epoxy resin from Henkel Corp., having offices in California, USA.

The integrated memory assembly 207 may for example be stacked with a stepped offset, leaving the bond pads at each level uncovered and accessible from above. Wire bonds 270 connected to the bond pads connect the control die 211 to the substrate 271. A number of such wire bonds may be formed across the width of each control die 211 (i.e., into the page of FIG. 3A).

A memory die through silicon via (TSV) 276 may be used to route signals through a memory structure die 201. A control die through silicon via (TSV) 278 may be used to route signals through a control die 211. The TSVs 276, 278 may be formed before, during or after formation of the integrated circuits in the semiconductor dies 201, 211. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package. The solder balls 272 may form a part of the interface between integrated memory assembly 207 and memory controller 120.

Figure 3B:
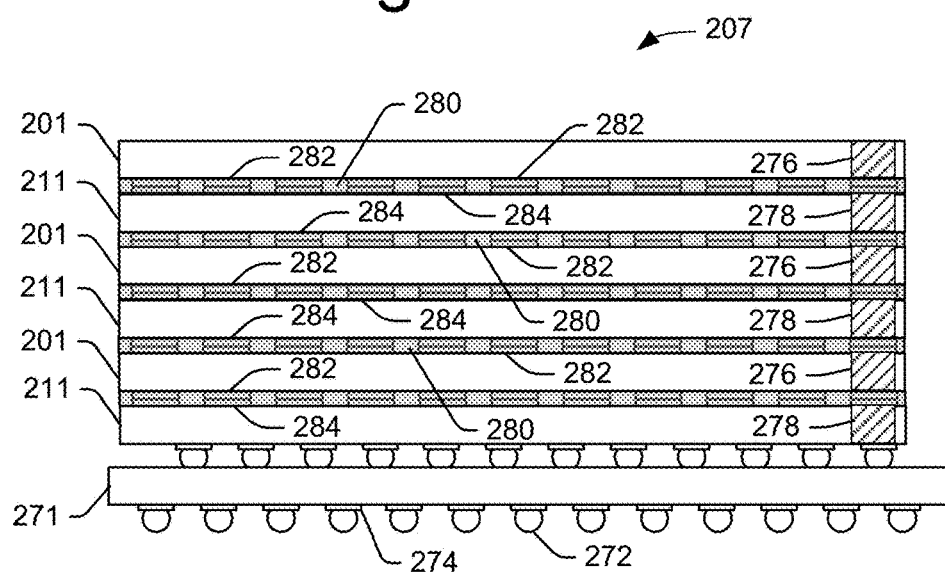

FIG. 3B depicts a side view of another embodiment of an integrated memory assembly 207 stacked on a substrate 271. The integrated memory assembly 207 of FIG. 3B has three control dies 211 and three memory structure dies 201. In some embodiments, there are many more than three memory structure dies 201 and many more than three control dies 211. In this example, each control die 211 is bonded to at least one memory structure die 201. Optionally, a control die 211 may be bonded to two or more memory structure dies 201.

Some of the bond pads 282, 284 are depicted. There may be many more bond pads. A space between two dies 201, 211 that are bonded together is filled with a solid layer 280, which may be formed from epoxy or other resin or polymer. In contrast to the example in FIG. 3A, the integrated memory assembly 207 in FIG. 3B does not have a stepped offset. A memory die through silicon via (TSV) 276 may be used to route signals through a memory structure die 201. A control die through silicon via (TSV) 278 may be used to route signals through a control die 211.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package.

As has been briefly discussed above, the control die 211 and the memory structure die 201 may be bonded together. Bond pads on each die 201, 211 may be used to bond the two die together. In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat may also be applied. In embodiments using Cu-to-Cu bonding, the bond pads may be about 5 μm square and spaced from each other with a pitch of 5 μm to 5 μm. While this process is referred to herein as Cu-to-Cu bonding, this term may also apply even where the bond pads are formed of materials other than Cu.

When the area of bond pads is small, it may be difficult to bond the semiconductor die together. The size of, and pitch between, bond pads may be further reduced by providing a film layer on the surfaces of the semiconductor die including the bond pads. The film layer is provided around the bond pads. When the die are brought together, the bond pads may bond to each other, and the film layers on the respective die may bond to each other. Such a bonding technique may be referred to as hybrid bonding. In embodiments using hybrid bonding, the bond pads may be about 5 μm square and spaced from each other with a pitch of 1 μm to 5 μm. Bonding techniques may be used providing bond pads with even smaller sizes and pitches.

Some embodiments may include a film on surface of the dies 201, 211. Where no such film is initially provided, a space between the die may be under filled with an epoxy or other resin or polymer. The under-fill material may be applied as a liquid which then hardens into a solid layer. This under-fill step protects the electrical connections between the dies 201, 211, and further secures the die together. Various materials may be used as under-fill material.

Figure 4:
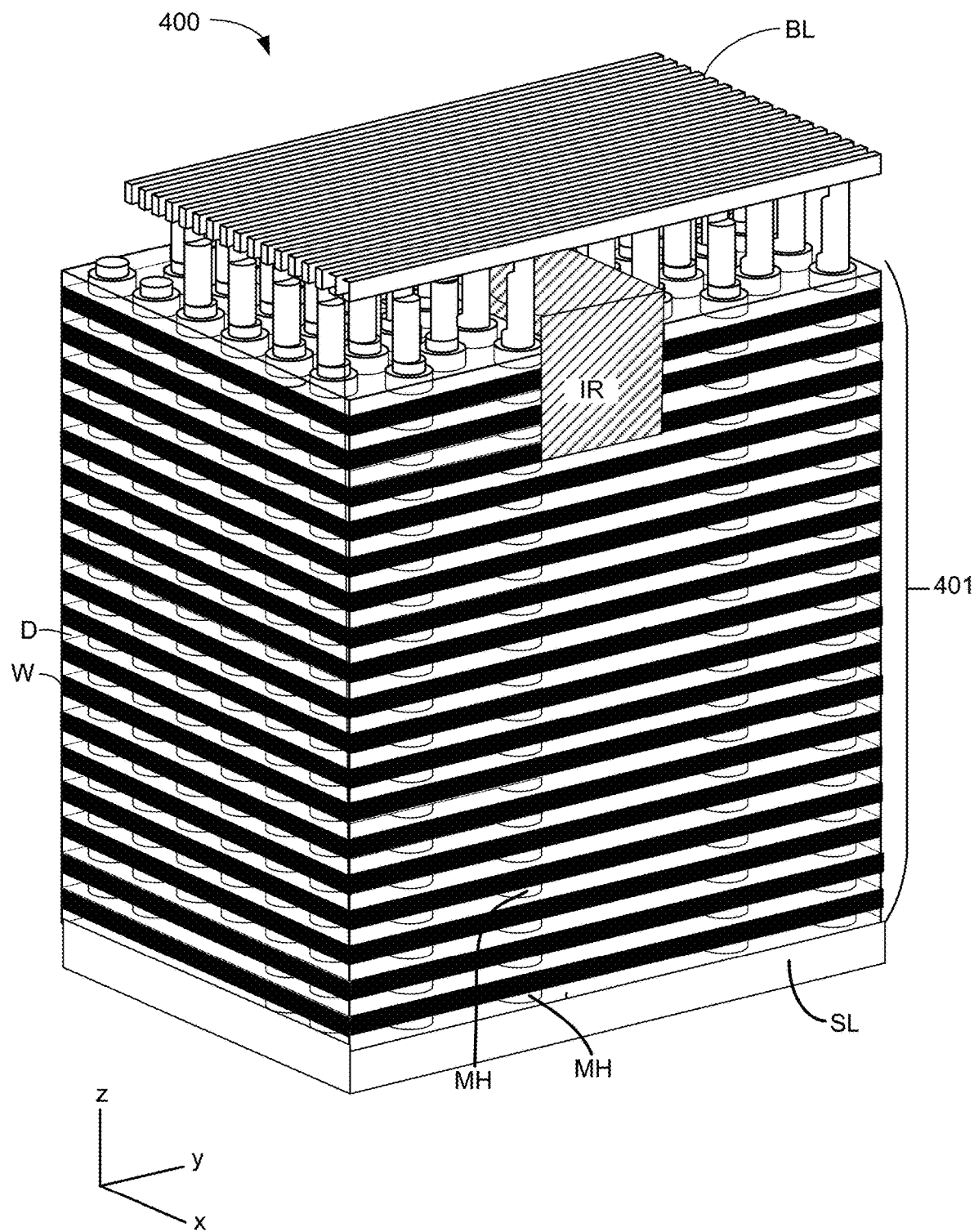
FIG. 4 is a perspective view of a portion of one example embodiment of a monolithic three dimensional memory structure.

FIG. 4 is a perspective view of a portion of one example embodiment of a monolithic three dimensional memory array/structure that can comprise memory structure 202, which includes a plurality non-volatile memory cells arranged as vertical NAND strings. For example, FIG. 4 shows a portion 400 of one block of memory. The structure depicted includes a set of bit lines BL positioned above a stack 401 of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. In one embodiment the alternating dielectric layers and conductive layers are divided into four (or a different number of) regions (e.g., sub-blocks) by isolation regions IR. FIG. 4 shows one isolation region IR separating two sub-blocks. Below the alternating dielectric layers and word line layers is a source line layer SL. Memory holes are formed in the stack of alternating dielectric layers and conductive layers. For example, one of the memory holes is marked as MH. Note that in FIG. 4, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. More details of the three dimensional monolithic memory array that comprises memory structure 202 is provided below.

Figure 4A:
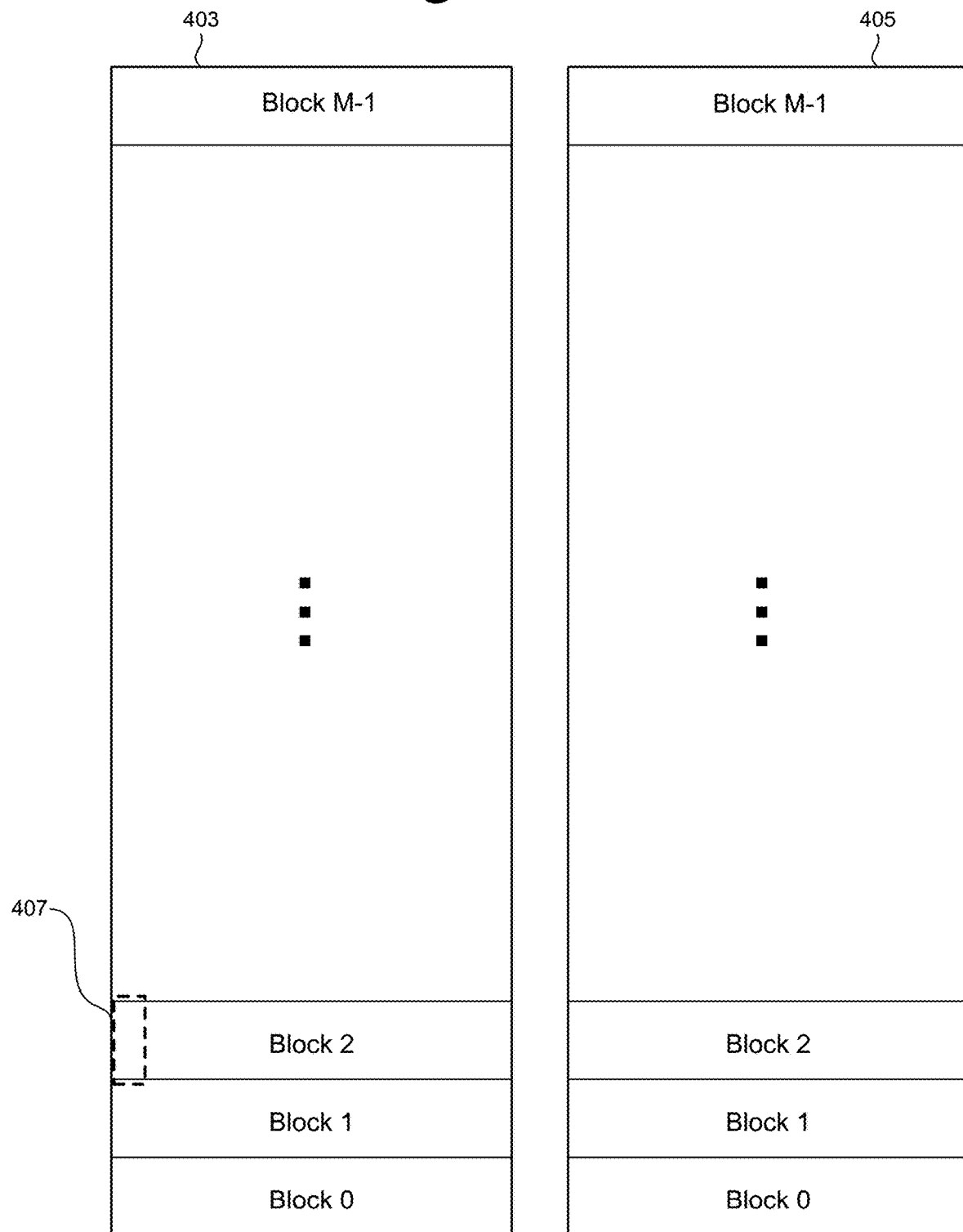
FIG. 4A is a block diagram of one embodiment of a memory structure having two planes.

FIG. 4A is a block diagram explaining one example organization of memory structure 202, which is divided into two planes 403 and 405. Each plane is then divided into M blocks. In one example, each plane has about 2000 blocks. However, different numbers of blocks and planes can also be used. In one embodiment, a block of memory cells is a unit of erase. That is, all memory cells of a block are erased together. In other embodiments, blocks can be divided into sub-blocks and the sub-blocks can be the unit of erase. Memory cells can also be grouped into blocks for other reasons, such as to organize the memory structure to enable the signaling and selection circuits. In some embodiments, a block represents a groups of connected memory cells as the memory cells of a block share a common set of word lines. For example, the word lines for a block are all connected to all of the vertical NAND strings for that block. Although FIG. 4A shows two planes 403/405, more or fewer than two planes can be implemented. In some embodiments, memory structure 202 includes four planes. In some embodiments, memory structure 202 includes eight planes. In some embodiments, programming can be performed in parallel in a first selected block in plane 403 and a second selected block in plane 405.

Figure 4B:
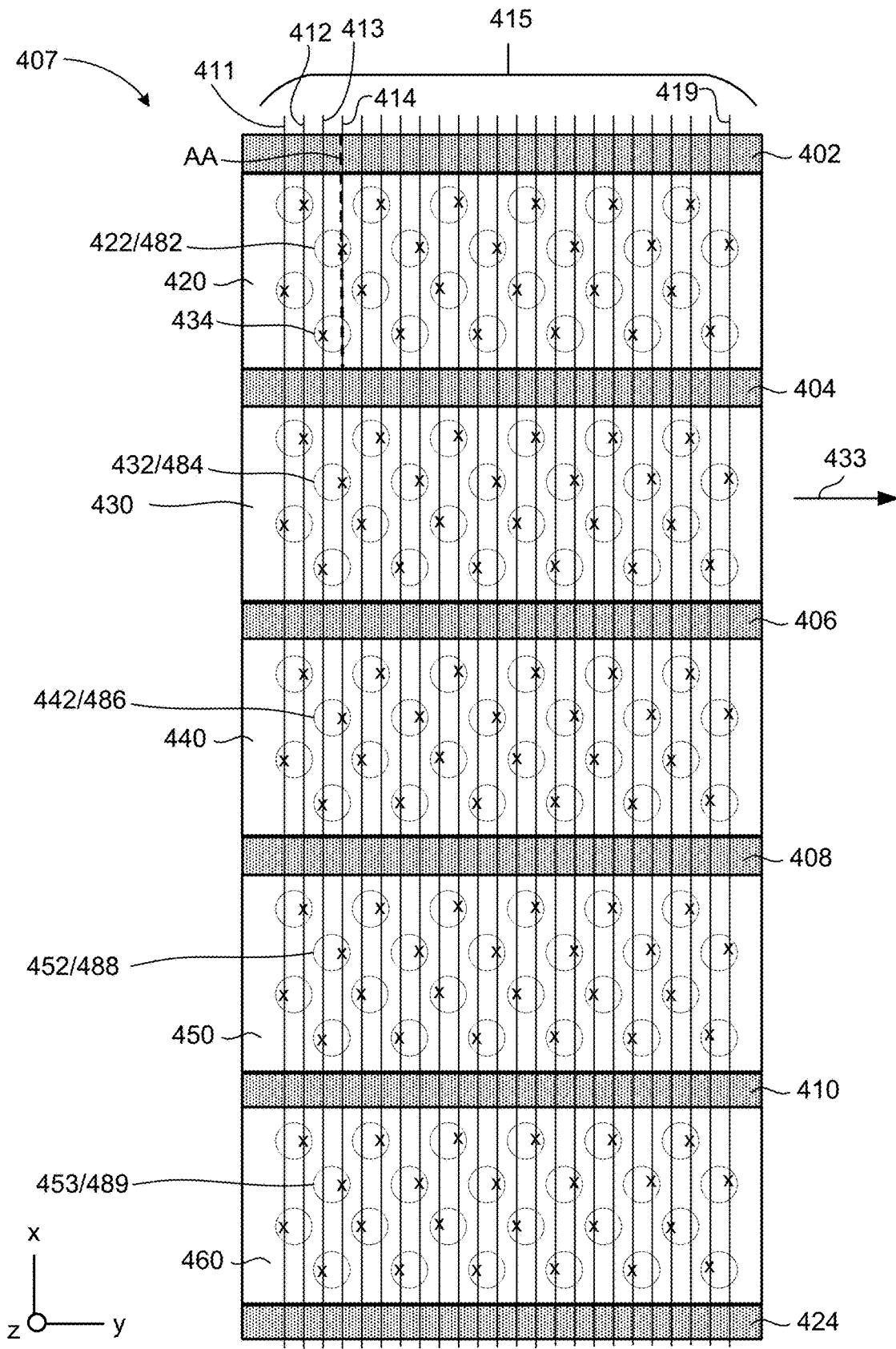
FIG. 4B is a block diagram depicting a top view of a portion of block of memory cells.

FIGS. 4B-4E depict an example three dimensional ("3D") NAND structure that corresponds to the structure of FIG. 4 and can be used to implement memory structure 202 of FIGS. 2A and 2B. FIG. 4B is a block diagram depicting a top view of a portion 407 of Block 2. As can be seen from FIG. 4B, the block depicted in FIG. 4B extends in the direction of arrow 433. In one embodiment, the memory array has many layers; however, FIG. 4B only shows the top layer.

FIG. 4B depicts a plurality of circles that represent the vertical columns. Each of the vertical columns include multiple select transistors (also referred to as a select gate or selection gate) and multiple memory cells. In one embodiment, each vertical column implements a NAND string. For example, FIG. 4B depicts vertical columns 422, 432, 442, 452, and 453. Vertical column 422 implements NAND string 482. Vertical column 432 implements NAND string 484. Vertical column 442 implements NAND string 486. Vertical column 452 implements NAND string 488. Vertical column 453 implements NAND string 489. More details of the vertical columns are provided below. Since the block depicted in FIG. 4B extends in the direction of arrow 433, the block includes more vertical columns than depicted in FIG. 4B.

FIG. 4B also depicts a set of bit lines 415, including bit lines 411, 412, 413, 414, . . . 419. FIG. 4B shows twenty-four bit lines because only a portion of the block is depicted. It is contemplated that more than twenty-four bit lines connected to vertical columns of the block. Each of the circles representing vertical columns has an "x" to indicate its connection to one bit line. For example, bit line 414 is connected to vertical columns 422, 432, 442, 452, and 453.

The block depicted in FIG. 4B includes a set of isolation regions 402, 404, 406, 408, 410, and 424, which are formed of $SiO_2$; however, other dielectric materials can also be used. Isolation regions 402, 404, 406, 408, 410, and 424 serve to divide the top layers of the block into five regions; for example, the top layer depicted in FIG. 4B is divided into regions 420, 430, 440, 450, and 460 of which are referred to as sub-blocks. In one embodiment, isolation regions 402 and 424 separate the block from adjacent blocks. Thus, isolation regions 402 and 424 may extend down to the substrate. In one embodiment, the isolation regions 404, 406, 408, and 410 only divide the layers used to implement select gates so that NAND strings in different sub-blocks can be independently selected. Referring back to FIG. 4, the IR region may correspond to any of isolation regions 404, 406, 408 or 410. In one example implementation, a bit line only connects to one vertical column/NAND string in each of regions (sub-blocks) 420, 430, 440, 450 and 460. In that implementation, each block has twenty rows of active columns and each bit line connects to five vertical columns/NAND strings in each block. In one embodiment, all of the five vertical columns/NAND strings connected to a common bit line are connected to the same word line (or set of word lines); therefore, the system uses the drain side selection lines to choose one (or another subset) of the four to be subjected to a memory operation (program, verify, read, and/or erase).

Although FIG. 4B shows each region having four rows of vertical columns, five regions and twenty rows of vertical columns in a block, those exact numbers are an example implementation. Other embodiments may include more or fewer regions per block, more or fewer rows of vertical columns per region and more or fewer rows of vertical columns per block. FIG. 4B also shows the vertical columns being staggered. In other embodiments, different patterns of staggering can be used. In some embodiments, the vertical columns are not staggered.

Figure 4C:
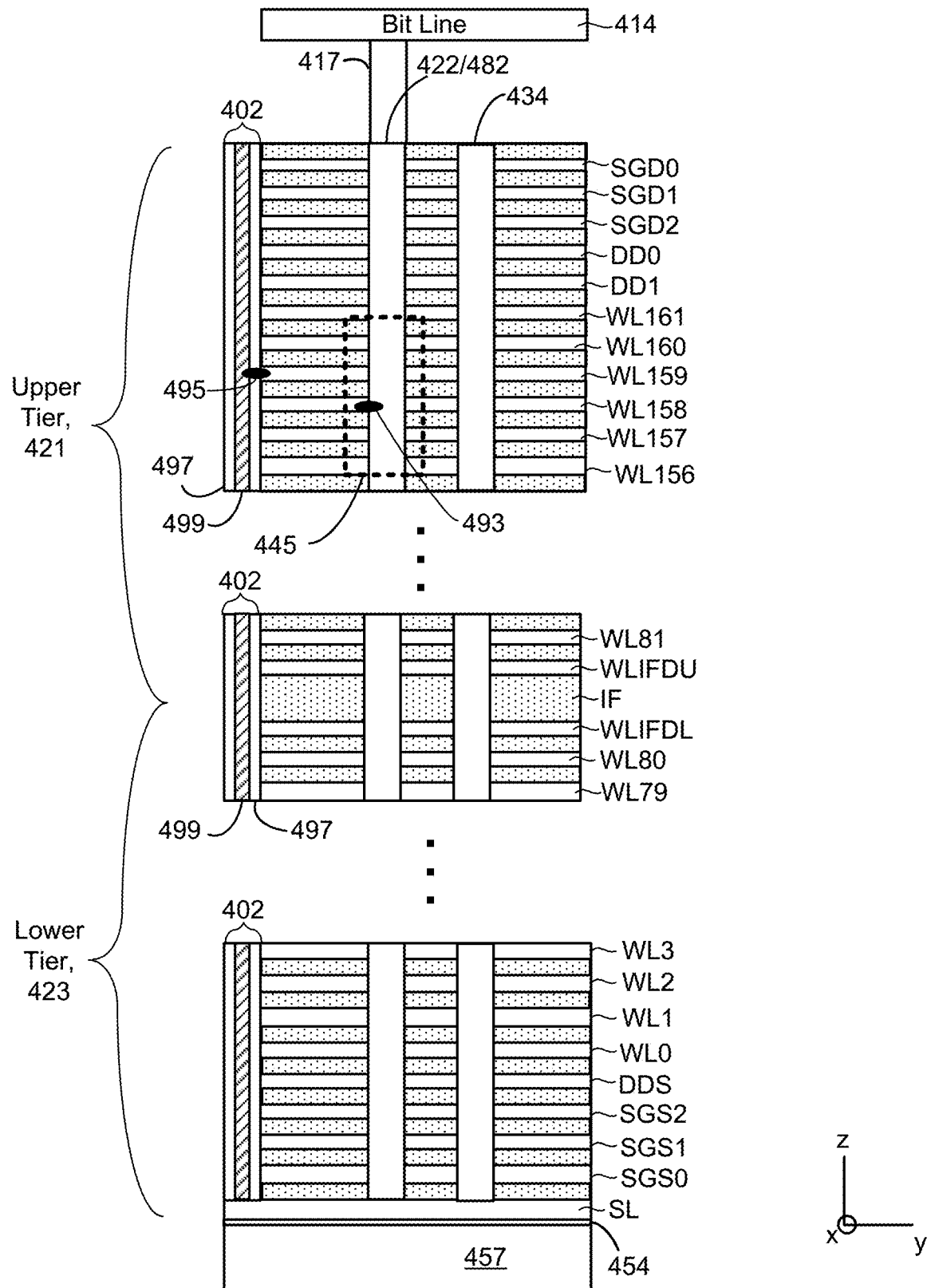
FIG. 4C depicts an embodiment of a stack showing a cross-sectional view along line AA of FIG. 4B.

FIG. 4C depicts a portion of one embodiment of a three dimensional memory structure 202 showing a cross-sectional view along line AA of FIG. 4B. This cross sectional view cuts through vertical columns (NAND strings) 422 and 434 of region 420 (see FIG. 4B). The structure of FIG. 4C includes three drain side select gate layers (SGD0, SGD1 and SGD2). The structure of FIG. 4C also includes three source side select gate layers (SGS0, SGS1 and SGS2). The structure of FIG. 4C also includes five dummy word line layers DD0, DD1, WLIFDU, WLIDDL, DDS; one hundred sixty two word line layers WL0-WL161 for connecting to data memory cells. Dielectric layers are depicted between the conductive layers just described. Other embodiments can implement more or fewer than the numbers described above for FIG. 4C. In one embodiment, SGD0, SGD1 and SGD2 are electrically connected together; and SGS0, SGS1 and SGS2 are electrically connected together.

FIG. 4C depicts an embodiment of a stack having two tiers. The two-tier stack comprises an upper tier 421 and a lower tier 423. A two-tier other multi-tier stack can be used to form a relatively tall stack while maintaining a relatively narrow memory hole width (or diameter). After the layers of the lower tier are formed, memory hole portions are formed in the lower tier. Subsequently, after the layers of the upper tier are formed, memory hole portions are formed in the upper tier, aligned with the memory hole portions in the lower tier to form continuous memory holes from the bottom to the top of the stack. The resulting memory hole is narrower than would be the case if the hole was etched from the top to the bottom of the stack rather than in each tier individually. An interface (IF) region is created where the two tiers are connected. The IF region is typically thicker than the other dielectric layers. Due to the presence of the IF region, the adjacent word line layers suffer from edge effects such as difficulty in programming or erasing. These adjacent word line layers can therefore be set as dummy word lines (WLIFDL, WLIFDU). In some embodiments, the upper tier 421 and the lower tier 423 are erased independent of one another. Hence, data may be maintained in the lower tier 423 after the upper tier 421 is erased. Likewise, data may be maintained in the upper tier 421 after the lower tier 423 is erased.

Vertical columns 432 and 434 are depicted protruding through the drain side select layers, source side select layers, IF layer, dummy word line layers and word line layers. In one embodiment, each vertical column comprises a vertical NAND string. Below the vertical columns and the layers listed below is substrate 457, an insulating film 454 on the substrate, and source line SL. The NAND string of vertical column 432 has a source end at a bottom of the stack and a drain end at a top of the stack. As in agreement with FIG. 4B, FIG. 4C show vertical column 432 connected to bit line 414 via connector 417.

One of the isolation regions 402 is depicted adjacent to the stack, in agreement with FIG. 4B. The isolation region 402 has a conductive region 499 surrounded by an insulating material 497. The conductive region 499 extends down to the source line (SL) and provides operating voltages to the SL. The conductive region 499 may be formed from, for example, tungsten. The insulating material 497 may be formed from, for example, silicon oxide. It is possible for a short circuit to occur between a word line and the conductive region 499. An example defect 495 that results in a short circuit between WL159 and the conductive region 499 is depicted. The conductive region 499 may be referred to herein as a local interconnect (LI). In one embodiment, such word line to LI short circuits are detected. Defects such as defect 495 may be present when the memory structure is manufactured or may develop as a result of normal memory operations.

Another type of short circuit that may be detected is a word line to memory hole short circuit. Defect 493 may result in a short circuit between WL158 and the memory hole 422. In one embodiment, such word line to memory hole short circuits are detected. Defects such as defect 493 may be present when the memory structure is manufactured or may develop as a result of normal memory operations.

For ease of reference, drain side select layers, source side select layers, dummy word line layers, and data word line layers collectively are referred to as the conductive layers. In one embodiment, the conductive layers are made from a combination of TiN and Tungsten. In other embodiments, other materials can be used to form the conductive layers, such as doped polysilicon, metal such as Tungsten or metal silicide. In some embodiments, different conductive layers can be formed from different materials. Between conductive layers are dielectric layers. In one embodiment, the dielectric layers are made from $SiO_2$. In other embodiments, other dielectric materials can be used to form the dielectric layers.

The non-volatile memory cells are formed along vertical columns which extend through alternating conductive and dielectric layers in the stack. In one embodiment, the memory cells are arranged in NAND strings. The word line layers WL0-W161 connect to memory cells (also called data memory cells). Dummy word line layers DD0, DD1 and DDS connect to dummy memory cells. A dummy memory cell does not store and is not eligible to store host data (data provided from the host, such as data from a user of the host), while a data memory cell is eligible to store host data. In some embodiments, data memory cells and dummy memory cells may have a same structure. Drain side select layers SGD0, SGD1, and SGD2 are used to electrically connect and disconnect (or cut off) the channels of respective NAND strings from bit lines. Source side select layers SGS0, SGS1, and SGS2 are used to electrically connect and disconnect (or cut off) the channels of respective NAND strings from the source line SL.

Figure 4D:
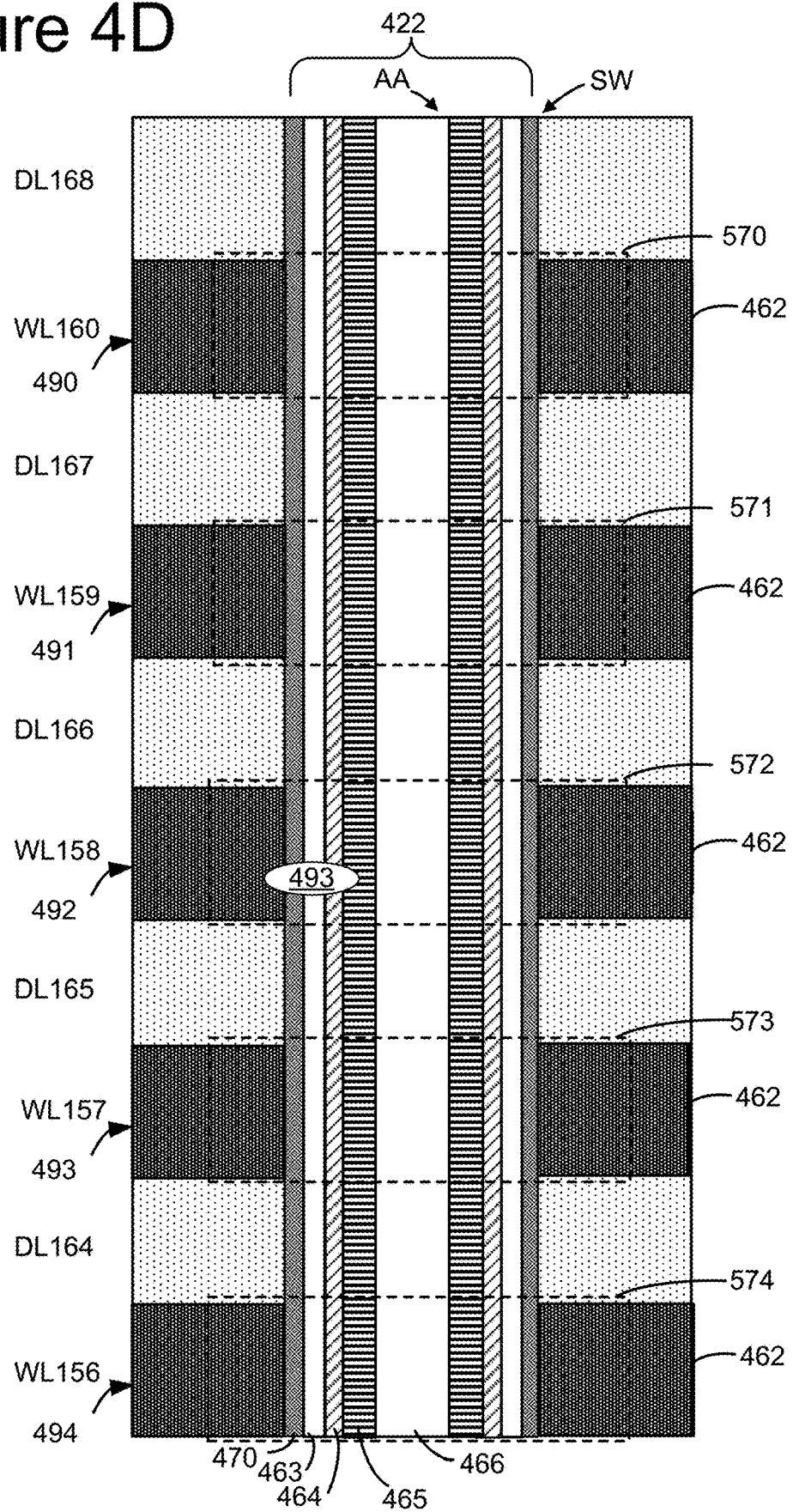
FIG. 4D depicts a view of the region 445 of FIG. 4C.

FIG. 4D depicts a view of the region 445 of FIG. 4C. Included are WL156-160 and dielectric layers DL164-DL168. Data memory cell transistors 570, 571, 572, 573, and 574 are indicated by the dashed lines. A number of layers can be deposited along the sidewall (SW) of the memory hole 422 and/or within each word line layer, e.g., using atomic layer deposition. For example, each column (e.g., the pillar which is formed by the materials within a memory hole) can include a blocking oxide/block high-k material 470, charge-trapping layer or film 463 such as SiN or other nitride, a tunneling layer 464, a polysilicon body or channel 465, and a dielectric core 466. A word line layer can include a conductive metal 462 such as Tungsten as a control gate. For example, control gates 490, 491, 492, 493 and 494 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

As mentioned above, one type of short circuit that may be detected is a word line to memory hole short circuit. Defect 493 may result in a short circuit between WL158 and one or more of the layers in the memory hole 422 such as, for example, charge-trapping layer 463 and/or polysilicon body 465. In one embodiment, such word line to memory hole short circuits are detected.

When a data memory cell transistor is programmed, electrons are stored in a portion of the charge-trapping layer which is associated with the data memory cell transistor. These electrons are drawn into the charge-trapping layer from the channel, and through the tunneling layer. The Vth of a data memory cell transistor is increased in proportion to the amount of stored charge. During an erase operation, the electrons return to the channel.

Each of the memory holes can be filled with a plurality of annular layers (also referred to as memory film layers) comprising a blocking oxide layer, a charge trapping layer, a tunneling layer and a channel layer. A core region of each of the memory holes is filled with a body material, and the plurality of annular layers are between the core region and the WLLs in each of the memory holes. In some cases, the tunneling layer 464 can comprise multiple layers such as in an oxide-nitride-oxide configuration.

Figure 4E:
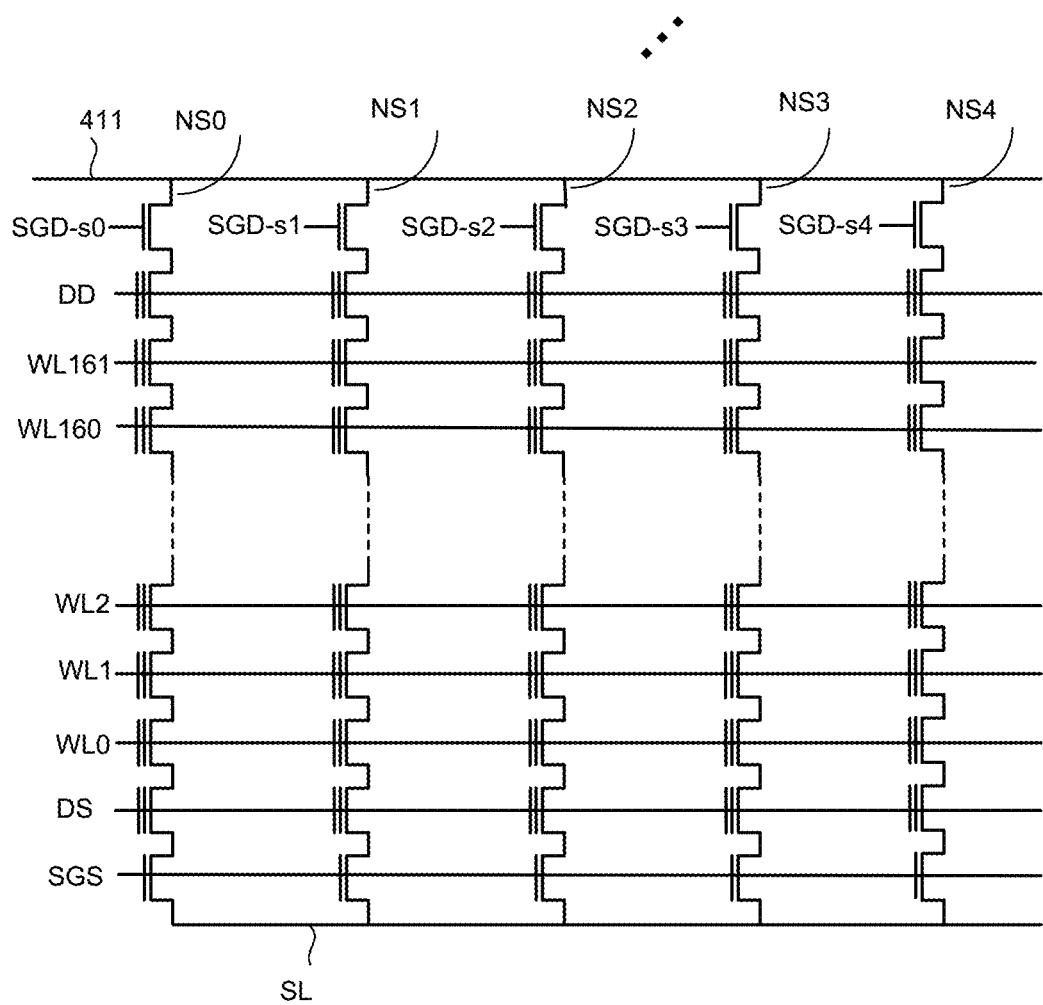
FIG. 4E is a schematic diagram of a portion of one embodiment of a block, depicting several NAND strings.

FIG. 4E is a schematic diagram of a portion of the memory depicted in in FIGS. 4-4D. FIG. 4E shows physical word lines WL0-WL161 running across the entire block. The structure of FIG. 4E corresponds to portion 407 in Block 2 of FIGS. 4A-4B, including bit lines 411, 412, 413, 414, ... 419. Within the block, each bit line is connected to four NAND strings. Drain side selection lines SGD-s0, SGD-s1, SGD-s2, SGD-s3 and SGD-s4 are used to determine which of the five NAND strings (NS0, NS1, NS2, NS3, NS4) connect to the associated bit line. Other NAND strings of the block and other bit lines are not depicted in FIG. 4E. A first sub-block corresponds to those vertical NAND strings controlled by SGD-s0. A second sub-block corresponds to those vertical NAND strings controlled by SGD-s1. A third sub-block corresponds to those vertical NAND strings controlled by SGD-s2. A fourth sub-block corresponds to those vertical NAND strings controlled by SGD-s3. A fifth sub-block corresponds to those vertical NAND strings controlled by SGD-s4. There may be more or fewer than five sub-blocks in a block.

A source side selection line SGS connects/disconnects the NAND strings to/from the common source line. In some embodiments, there is a source side selection line for each sub-block (similar to the five SGD-s0, SGD-s1, SGD-s2, SGD-s3 and SGD-s4). The block can also be thought of as divided into five sub-blocks SB0, SB1, SB2, SB3, SB4. Sub-block SB0 corresponds to those vertical NAND strings controlled by SGD-s0, Sub-block SB1 corresponds to those vertical NAND strings controlled by SGD-s1, Sub-block SB2 corresponds to those vertical NAND strings controlled by SGD-s2, Sub-block SB3 corresponds to those vertical NAND strings controlled by SGD-s3, and Sub-block SB4 corresponds to those vertical NAND strings controlled by SGD-s4.

Although the example memories of FIGS. 4-4E are three dimensional memory structure that includes vertical NAND strings with charge-trapping material, other (2D and 3D) memory structures can also be used with the technology described herein.

The memory systems discussed above can be erased, programmed and read. Each memory cell may be associated with a memory state according to write data in a program command. Based on its memory state, a memory cell will either remain in the erased state or be programmed to a memory state (a programmed memory state) different from the erased state.

For example, in a two-bit per cell memory device (sometimes referred to as a multi-level cell (MLC)), there are four memory states including the erased state and three programmed memory states referred to as the A, B and C memory states. In a three-bit per cell memory device (sometimes referred to as a tri-level cell (TLC)), there are eight memory states including the erased state and seven programmed memory states referred to as the A, B, C, D, E, F and G memory states. In a four-bit per cell memory device (sometimes referred to as a quad-level cell (QLC)), there are sixteen memory states including the erased state and fifteen programmed memory states referred to as the Er, S1, S2, S3, S4, S5, S6, S7, S8, S9, S10, S11, S12, S13, S14 and S15 memory states.

FIG. 5A depicts an embodiment of threshold voltage Vth distributions for a four-state memory device in which each memory cell stores two bits of data. A first threshold voltage Vth distribution 500 is provided for erased (Er-state) storage elements. Three threshold voltage Vth distributions 502, 504 and 506 represent programmed memory states A, B and C, respectively. A 2-bit code having lower and upper bits can be used to represent each of the four memory states. In an embodiment, the "Er," "A," "B," and "C" memory states are respectively represented by "11," "01," "00," and "10."

FIG. 5B depicts an embodiment of threshold voltage Vth distributions for an eight-state memory device in which each memory cell stores three bits of data. A first threshold voltage Vth distribution 510 is provided for Er-state storage elements. Seven threshold voltage Vth distributions 512, 514, 516, 518, 520, 522 and 524 represent programmed memory states A, B, C, D, E, F and G, respectively. A 3-bit code having lower page, middle page and upper page bits can be used to represent each of the eight memory states. In an embodiment, the "Er," "A," "B," "C," "D," "E," "F" and "G" memory states are respectively represented by "111," "011," "001," "000," "010," "110," "100" and "101."

FIG. 5C depicts an embodiment of threshold voltage Vth distributions for a sixteen-state memory device in which each memory cell stores four bits of data. A first threshold voltage Vth distribution 530 is provided for erased Er-state storage elements. Fifteen threshold voltage Vth distributions 532, 534, 536, 538, 540, 542, 544, 546, 548, 550, 552, 554, 556, 558 and 560 represent programmed memory states S1, S2, S3, S4, S5, S6, S7, S8, S9, S10, S11, S12, S13, S14 and S15, respectively.

A 4-bit code having lower page, middle page, upper page and top page bits can be used to represent each of the sixteen memory states. In an embodiment, the S0, S1, S2, S3, S4, S5, S6, S7, S8, S9, S10, S11, S12, S13, S14 and S15 memory states are respectively represented by "1111," "1110," "1100," "1101," "1001," "0001," "0101," "0100," "0110," "0010," "0000," "1000," "1010," "1011," "0011," and "0111," respectively.

The technology described herein also can be used with other types of programming in addition to full sequence programming (including, but not limited to, multiple stage/phase programming). In some embodiments, programmed states (e.g., S1-S15) can overlap, with controller 120 (FIG. 1) relying on error correction to identify the correct data being stored.

Figure 6:
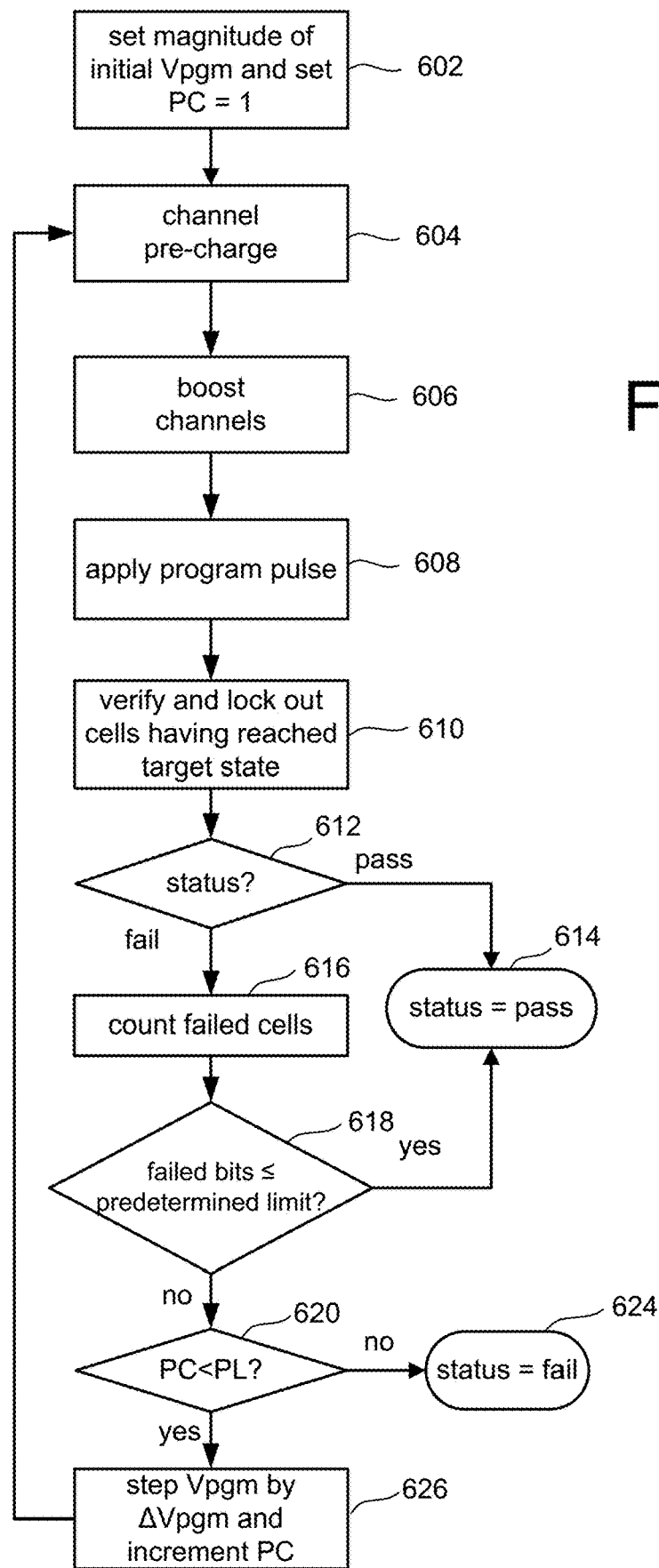
FIG. 6 is a flowchart describing one embodiment of a process for programming memory cells.

FIG. 6 is a flowchart describing one embodiment of a process for programming memory cells. For purposes of this document, the term program and programming are synonymous with write and writing. In one example embodiment, the process of FIG. 6 is performed for memory structure 202 using the one or more control circuits (e.g., system control logic 260, column control circuitry 210, row control circuitry 220) discussed above. In one example embodiment, the process of FIG. 6 is performed by integrated memory assembly 207 using the one or more control circuits (e.g., system control logic 260, column control circuitry 210, row control circuitry 220) of control die 211 to program memory cells on memory structure die 201. The process includes multiple loops, each of which includes a program phase and a verify phase. The process of FIG. 6 is performed to implement the full sequence programming, as well as other programming schemes including multi-stage programming. When implementing multi-stage programming, the process of FIG. 6 is used to implement any/each stage of the multi-stage programming process.

Typically, the program voltage applied to the control gates (via a selected data word line) during a program operation is applied as a series of program pulses (e.g., voltage pulses). Between programming pulses a set of verify pulses (e.g., voltage pulses) may be used to perform verification. In many implementations, the magnitude of the program pulses is increased with each successive pulse by a predetermined step size. In step 602 of FIG. 6, the programming voltage signal (Vpgm) is initialized to the starting magnitude (e.g., ~12-16V or another suitable level) and a program counter PC maintained by state machine 262 is initialized at 1. In one embodiment, the group of memory cells selected to be programmed (referred to herein as the selected memory cells) are programmed concurrently and are all connected to the same word line (the selected word line). There will likely be other memory cells that are not selected for programming (unselected memory cells) that are also connected to the selected word line. That is, the selected word line will also be connected to memory cells that are supposed to be inhibited from programming. Additionally, as memory cells reach their intended target data state, they will be inhibited from further programming. Those NAND strings (e.g., unselected NAND strings) that include memory cells connected to the selected word line that are to be inhibited from programming have their channels boosted to inhibit programming. When a channel has a boosted voltage, the voltage differential between the channel and the word line is not large enough to cause programming. To assist in the boosting, in step 604 the control die will pre-charge channels of NAND strings that include memory cells connected to the selected word line that are to be inhibited from programming. In step 606, NAND strings that include memory cells connected to the selected word line that are to be inhibited from programming have their channels boosted to inhibit programming. Such NAND strings are referred to herein as "unselected NAND strings." In one embodiment, the unselected word lines receive one or more boosting voltages (e.g., ~7-11 volts) to perform boosting schemes. A program inhibit voltage is applied to the bit lines coupled the unselected NAND string.

In step 608, a program voltage pulse of the programming voltage signal Vpgm is applied to the selected word line (the word line selected for programming). If a memory cell on a NAND string should be programmed, then the corresponding bit line is biased at a program enable voltage. In step 608, the program pulse is concurrently applied to all memory cells connected to the selected word line so that all of the memory cells connected to the selected word line are programmed concurrently (unless they are inhibited from programming). That is, they are programmed at the same time or during overlapping times (both of which are considered concurrent). In this manner all of the memory cells connected to the selected word line will concurrently have their threshold voltage change, unless they are inhibited from programming.

In step 610, program verify is performed and memory cells that have reached their target states are locked out from further programming by the control die. Step 610 includes performing verification of programming by sensing at one or more verify reference levels. In one embodiment, the verification process is performed by testing whether the threshold voltages of the memory cells selected for programming have reached the appropriate verify reference voltage. In step 610, a memory cell may be locked out after the memory cell has been verified (by a test of the Vt) that the memory cell has reached its target state. For example, a memory cell may be locked out if it reaches a verify reference voltage.

If, in step 612, it is determined that all of the memory cells have reached their target threshold voltages (pass), the programming process is complete and successful because all selected memory cells were programmed and verified to their target states. A status of "PASS" is reported in step 614. Otherwise if, in step 612, it is determined that not all of the memory cells have reached their target threshold voltages (fail), then the programming process continues to step 616.

In step 616, the number of memory cells that have not yet reached their respective target threshold voltage distribution are counted. That is, the number of memory cells that have, so far, failed to reach their target state are counted. This counting can be done by state machine 262, memory controller 120, or another circuit. In one embodiment, there is one total count, which reflects the total number of memory cells currently being programmed that have failed the last verify step. In another embodiment, separate counts are kept for each data state.

In step 618, it is determined whether the count from step 616 is less than or equal to a predetermined limit. In one embodiment, the predetermined limit is the number of bits that can be corrected by error correction codes (ECC) during a read process for the page of memory cells. If the number of failed cells is less than or equal to the predetermined limit, than the programming process can stop and a status of "PASS" is reported in step 614. In this situation, enough memory cells programmed correctly such that the few remaining memory cells that have not been completely programmed can be corrected using ECC during the read process. In some embodiments, the predetermined limit used in step 618 is below the number of bits that can be corrected by error correction codes (ECC) during a read process to allow for future/additional errors. When programming fewer than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If the number of failed memory cells is not less than the predetermined limit, than the programming process continues at step 620 and the program counter PC is checked against the program limit value (PL). Examples of program limit values include 6, 12, 16, 19, 20 and 30; however, other values can be used. If the program counter PC is not less than the program limit value PL, then the program process is considered to have failed and a status of FAIL is reported in step 624. If the program counter PC is less than the program limit value PL, then the process continues at step 626 during which time the Program Counter PC is incremented by 1 and the programming voltage signal Vpgm is stepped up to the next magnitude. For example, the next pulse will have a magnitude greater than the previous pulse by a step size ΔVpgm (e.g., a step size of 0.1-1.0 volts). After step 626, the process loops back to step 604 and another program pulse is applied to the selected word line so that another iteration (steps 604-626) of the programming process of FIG. 6 is performed.

In one embodiment memory cells are erased prior to programming, and erasing is the process of changing the threshold voltage of one or more memory cells from a programmed data state to an erased data state. For example, changing the threshold voltage of one or more memory cells from states A-C to state E of FIG. 5A, from states A-G to state Er of FIG. 5B, or from states S1-S15 to state Er of FIG. 5C.

Technology is disclosed herein for detecting grown bad blocks in a non-volatile storage system. In an embodiment, a stress test is performed on a group of memory cells. The stress test may accelerate stressful conditions on the memory cells and thereby provide for early detection of grown bad blocks. Moreover, the number of grown bad blocks that escape detection is kept low. In an embodiment, the stress test involves generating an electric field (e-field) near a junction between word lines and a NAND string.

Figure 7:
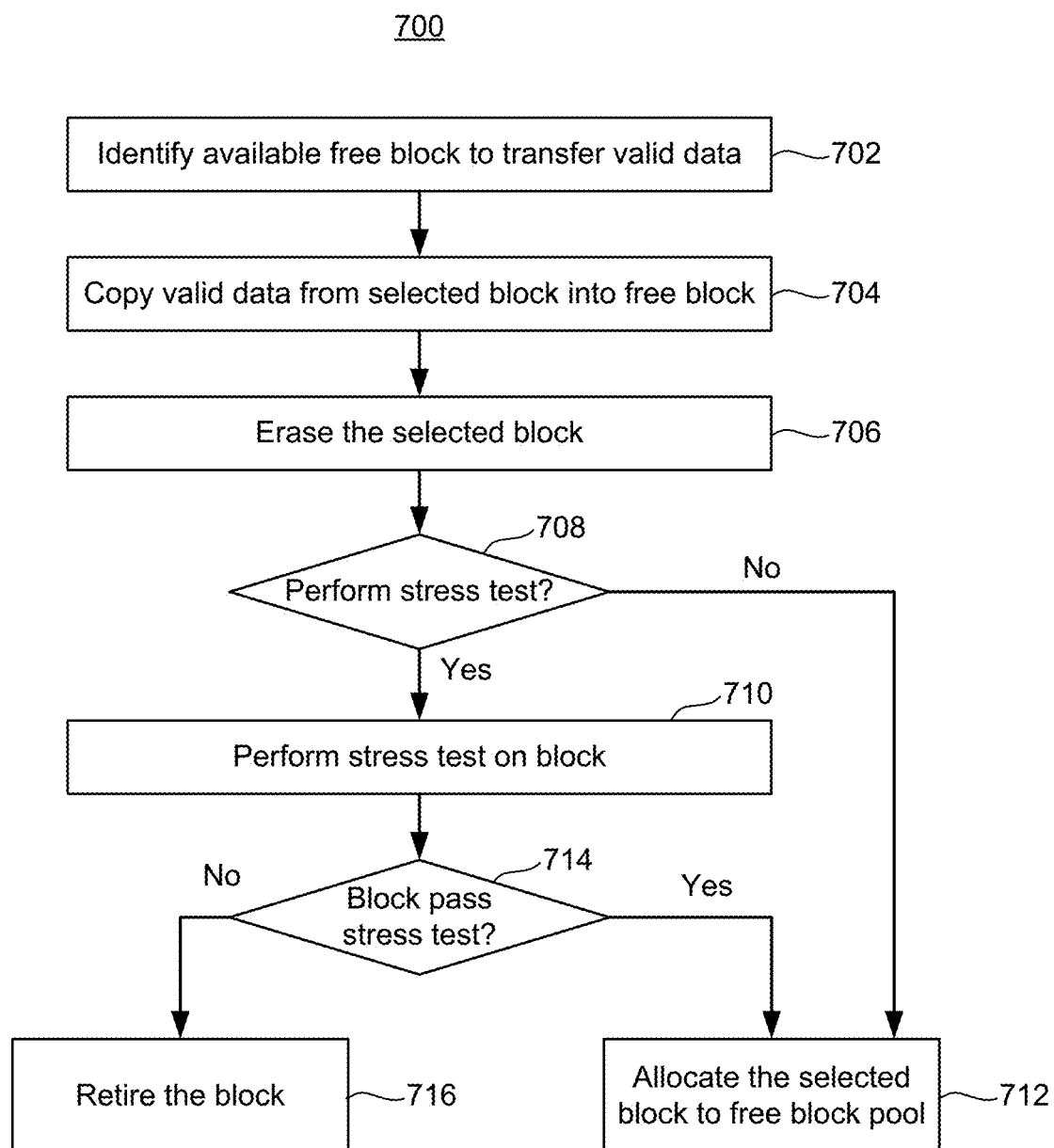
FIG. 7 is a flowchart of one embodiment of a process of detecting grown bad blocks in a non-volatile storage system.

FIG. 7 is a flowchart of one embodiment of a process 700 of detecting grown bad blocks in a non-volatile storage system. The process 700 may be performed by one or more control circuits in the storage system 100. Process 700 describes detecting grown bad blocks in the context of garbage collection. Garbage collection may include data compaction in which valid data from one or more source blocks is copied to one or more destination blocks. A source block may be identified for data compaction when the amount of valid data falls below a threshold percentage. Note that detecting grown bad blocks can be performed without garbage collection. In an alternative embodiment, detecting grown bad blocks is performed in response to a special command sequence. For example, the memory controller 120 could issue a command sequence to the die (memory die 200, control die 211) to detect grown bad blocks.

Step 702 includes identifying an available free block to transfer valid data. In an embodiment, the memory controller 120 identifies one or more free blocks in the storage 130. Step 704 includes copying valid data from a selected block to the free block. This copying may include data compaction. Step 706 includes erasing the selected block after the valid data has been successfully transferred. At this time a stress test may be performed on the selected block. However, the stress test is not necessarily performed each time that the selected block is erased. In one embodiment, the stress test is performed once each n program/erase cycles. The value of n could be, for example, 10, 20, or some other value. If the stress test is not to be performed (step 708 is no), then the selected block is allocated to a free block pool in step 712. Alternatively, the stress test may be performed in step 710. The stress test may accelerate stressful conditions on the memory cells and thereby provide for early detection of grown bad blocks. Moreover, the number of grown bad blocks that escape detection is kept low. Further details of embodiments of the stress test are described below. Step 714 includes a determination of whether the block passes the stress test. If the block passes the stress test, then the block is allocated to the free block pool in step 712. If the block fails the stress test, then the block is retired in step 716. The block may be retired by adding the block to a list of grown bad blocks. In an embodiment, the memory controller 120 maintains the list of free blocks and grown bad blocks.

Figure 8:
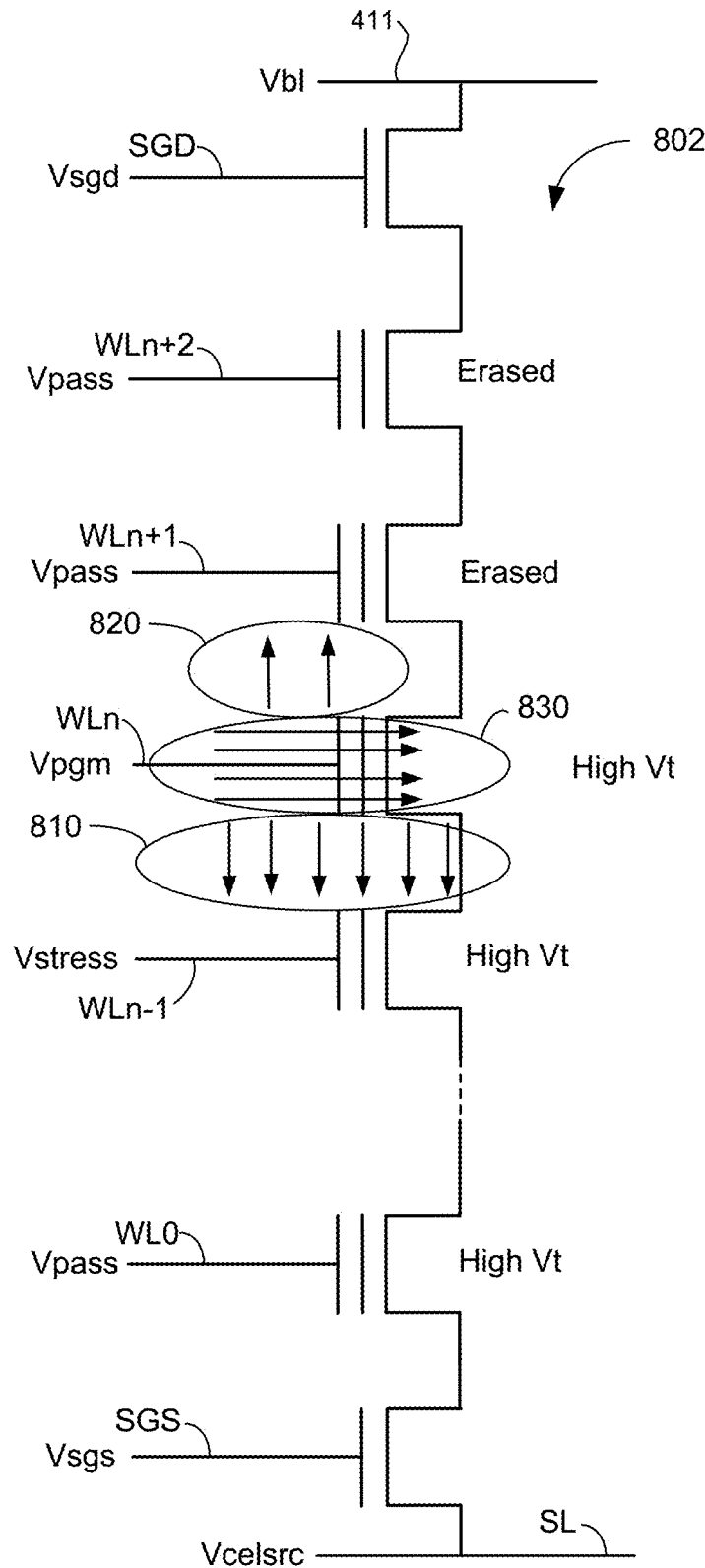
FIG. 8 is a schematic diagram of a NAND string depicting voltages applied during an embodiment of a stress test.

FIG. 8 is a schematic diagram of a NAND string depicting voltages applied during an embodiment of a stress test. The NAND string 802 is connected between a bit line 411 and a source line (SL). Only a few of the memory cells on the NAND string 802 are depicted. The uppermost transistor on the NAND string is a select transistor having a control gate connected to a select line SGD. The lowermost transistor on the NAND string is a select transistor having a control gate connected to a select line SGS. A select voltage Vsgd is applied to the select line SGD. A select voltage Vsgs is applied to the select line SGS. A program voltage Vpgm is applied to the selected word line WLn. A stress voltage Vstress is applied to WLn−1. WLn−1 is adjacent to one side of the selected word line. Boosting voltages Vpass are applied to the other unselected word lines (WL0, WLn+1, WLn+2 are depicted, but there are numerous other unselected word lines).

The selected memory cell connected to WLn is being programmed to a high Vt. The high Vt may correspond to the highest data state for a normal programming algorithm. For example, with respect to the MLC example in FIG. 5A the highest data state is the C-state; with respect to the MLC example in FIG. 5B the highest data state is the G-state; and with respect to the MLC example in FIG. 5C the highest data state is the S15-state. In an embodiment, the memory cells are programmed one word line at a time from the source line to the bit line. Thus, the memory cells from WL0 to WLn−1 have already been programmed to the high Vt. However, memory cells between WLn and the bit line are still in the erased state.

The voltages will generate one or more electric fields, which may place stress on the memory cells. An electric field 810 that results from Vpgm being applied to WLn and Vstress being applied to WLn−1 is depicted. An electric field 820 that results from Vpgm being applied to WLn and Vpass being applied to WLn+1 is depicted. In an embodiment, Vpgm may be between about 12V to 20V, and may be increase from one program/verify loop to the next. In an embodiment, Vpass may be about 8V to 10V. In an embodiment, Vstress may be about 3V to 5V. Note that all of Vpgm, Vpass, and Vstress may differ from these examples. However, Vstress has a lower magnitude than Vpass, such that e-field 810 may be stronger than e-field 820. Also depicted is an e-field 830 that results applying Vpgm to the control gate of the selected memory cell given the Vt of the memory cell. The e-field 830 may be stronger than a typical e-field in normal programming. That is, normal programming may program one eighth of the memory cells to each of the eight data states in FIG. 5B. However, programming all of the memory cells to the highest Vt may result in e-field 830 being stronger than in normal programming, for at least the later program/verify loops. Therefore, e-field 810 and/or e-field 830 may be enhanced e-fields that create stress on the group of memory cells. For example, e-field 810 and/or e-field 830 may be greater than corresponding e-fields in normal programming. Moreover, the amount of stress created by e-field 810 can be controlled by choosing the magnitude of Vstress. If e-field 810 creates too much stress than some blocks that would not fail without any stress could fail as a result of the stress test. On the other hand if e-field 810 does not create enough stress than some blocks that would fail without any stress might escape detection with the stress test. Thus, the magnitude of Vstress can be selected to create an amount of stress that will result in most of the blocks that would have failed without the stress test being detected, but without damaging other blocks that would not have failed without the stress test.

Figure 9:
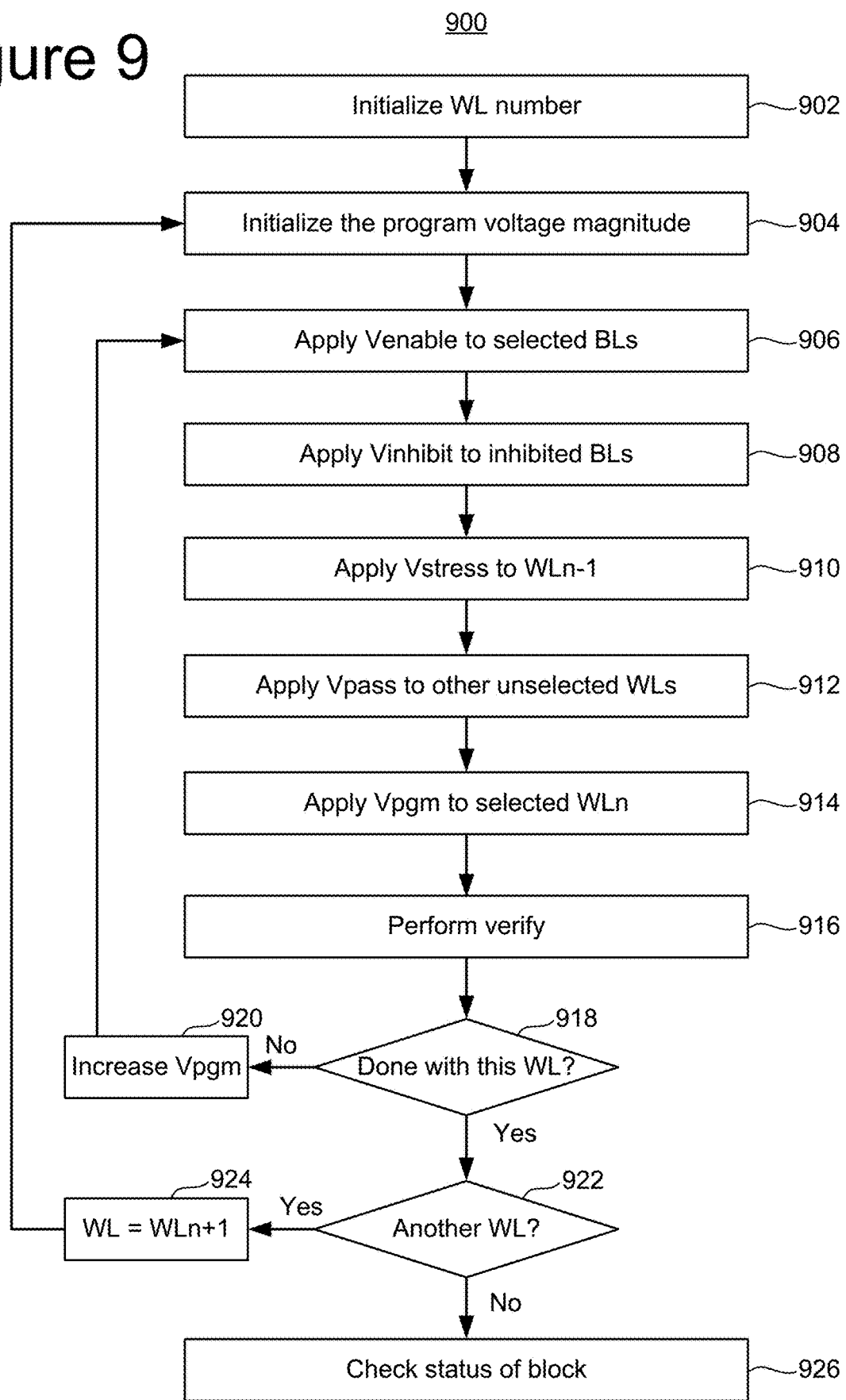
FIG. 9 is a flowchart of one embodiment of a process of performing a stress test on a group of memory cells.

FIG. 9 is a flowchart of one embodiment of a process 900 of performing a stress test on a group of memory cells. In one embodiment, the process 900 is performed on a block of memory cells. The block could store user data or system data. The process may be performed in step 708 of process 700. The process 900 may be performed during garbage collection, but is not required to be part of garbage collection. Step 902 includes initializing a WL number, which is an identifier of a presently selected word line. In an embodiment, the process sequentially goes through each word line in the block. Thus, the word line can be initialized to WL0 in step 902. Process 900 will be described with respect to the selected word line being WLn. Step 904 includes initializing a magnitude of a program voltage (Vpgm). In one embodiment, Vpgm could be initialized to about 12V. However, Vpgm could initialized at a higher or lower voltage.

Step 906 includes applying a program enable voltage (Venable) to bit lines that are associated with memory cells to receive programming. As an example, Venable may be 0V. These bit lines are referred to herein as selected bit lines. Step 908 includes applying a program inhibit voltage (Vinhibit) to bit lines that are associated with memory cells to be inhibited from programming. As an example, Vinhibit may be about 2V. In an embodiment, all memory cells are to be programmed to a high Vt. Therefore, the first program loop all bit lines may be enabled.

Step 910 includes applying Vstress to WLn−1, which is the last word line that was programmed. Step 912 includes applying Vpass to the other unselected word lines. Step 914 includes applying Vpgm to the selected word line (WLn). Steps 906, 908, 910, 912, and 914 are performed together.

Step 916 includes a verify operation. In process 900, all of the memory cells may be programmed to a high Vt data state. For example, with respect to FIG. 5B, all of the memory cells may be programmed to the G-state. Thus, all memory cells could be tested relative to VvG. If a memory cell has a Vt above VvG that memory cell may be inhibited from further programming by application of a program inhibit voltage to its bit line the next program loop. Step 918 is a determination of whether this presently selected word line is done with its portion of the stress test. This determination may be based on whether a sufficient number of memory cells have passed the verify test. For example if all but a few memory cells have passed verify for the high Vt state, then the portion of the stress test for this word line may conclude. If this word line is not done with the stress test, then Vpgm is incremented in step 920. The process than repeats steps 906-918. When the stress test for the presently selected word line is done, a determination is made in step 922 of whether there is another word line for which memory cells should be programmed. If so, the word line number is incremented in step 924. Then, the program voltage Vpgm is again initialized to its starting value in step 904. Steps 906-920 are then performed for this word line. When all memory cells in the block have been programmed, the status of the block is checked in step 926. There are a number of ways to check the status of the block.

Figure 10:
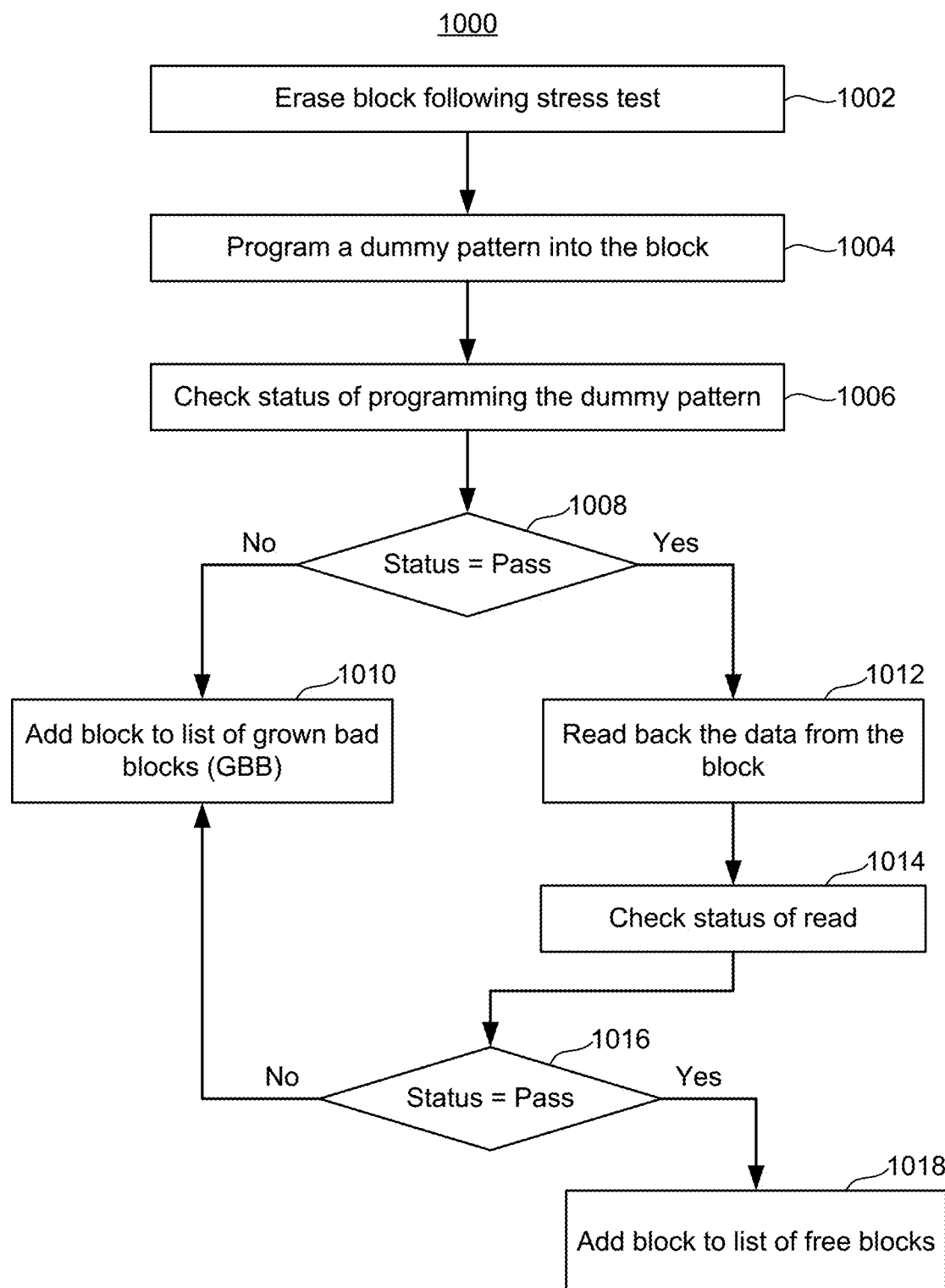
FIG. 10 is a flowchart of one embodiment of a process of a status check that follows a stress test.

FIG. 10 is a flowchart of one embodiment of a process 1000 of a status check that follows a stress test. The process 1000 may be used in an embodiment of step 926 in process 900. Step 1002 includes erasing the block following the stress test. Step 1004 includes programming a dummy pattern into the block. Step 1006 includes checking a status of programming the dummy pattern. The process of FIG. 6 may be used to program the dummy pattern. As one example, the dummy pattern could have an equal number of memory cells programmed to each of the Er to G-states (see FIG. 5B). Step 1008 is a determination of whether the status of programming the dummy pattern is pass. The criterion for passing programming can vary. In one embodiment, the dummy pattern is programmed in accordance with the flow in FIG. 6, with the status of pass indicated in step 614 and the status of fail indicated in step 624. If the programming the dummy pattern failed, then the block is added to a list of grown bad blocks in step 1010. If the programming the dummy pattern passed, then the data may be read back in step 1012. In step 1014, the status of the read is checked. The criterion for passing the read operation can vary. In one embodiment, the data that is read is compared with the dummy pattern. A count of the number of bits that are different from the dummy pattern may be made. If this number exceeds an allowed number, failure is indicated. In one embodiment, the data is provided to an ECC decoder, which detects errors and is capable of correcting errors. Pass or failure may be based on results of the decoding operation. For example, pass or failure may be based on a fail bit count (FBC), which is the number of bits in an ECC codeword that are in error. If the read status is a pass (step 1016), then the block is added to a pool of free blocks in step 1018. If the read status is a fail, then the block is added to a list of grown bad blocks. Note that process 1000 is one embodiment of a status check that follows a stress test. However, other techniques are possible for the status check.

In some embodiments, the programming that is performed in the stress test generates one or more e-fields that are enhanced relative to normal programming. FIG. 11 is a flowchart of one embodiment of a process 1100 of normal programming. FIG. 12 is a flowchart of one embodiment of a process 1200 of programming during a stress test. Processes 1100 and 1200 will be compared to facilitate explanation of an embodiment of generating one or more enhanced e-fields during the stress test.

With reference to FIG. 11, step 1102 includes applying a program voltage to the selected word line WLn. Step 1104 includes applying a boosting voltage Vpass to unselected word lines. This includes applying Vpass to WLn−1. Step 1106 includes verifying whether memory cells are programmed to at least four Vt distributions. Process 1100 may be used to program memory cells to two-bits per cell (four Vt distributions), three-bits per cell (eight Vt distributions), four-bits per cell (sixteen Vt distributions), etc. In each case, there is a highest Vt distribution. Step 1108 includes a determination of whether programming is done. If so, the process 1100 concludes. Step 1110 is to increase the program voltage if programming is not yet complete. The process then repeats steps 1102-1106 until programming is complete.

With reference to FIG. 12, step 1202 includes applying a program voltage to the selected word line WLn. Step 1204 includes applying a voltage that is lower than Vpass to WLn−1. For example, Vpass may be about 8V and Vstress may be about 3V to 5V. However, Vstress may be greater than 5V or less than 3V. Also, Vpass may be lower or higher than 8V. Step 1206 includes applying Vpass to other unselected word lines. This includes applying Vpass to WLn+1. Step 1208 includes verifying whether memory cells are programmed to the highest Vt distribution used in step 1106 of process 1100. If process 1100 used four Vt distributions then step 1208 test all memory cells for the highest of the four Vt distributions. If process 1100 used eight Vt distributions then step 1208 test all memory cells for the highest of the eight Vt distributions. If process 1100 used sixteen Vt distributions then step 1208 test all memory cells for the highest of the sixteen Vt distributions. Step 1210 includes a determination of whether programming is done. If so, the process 1200 concludes. Step 1212 is to increase the program voltage if programming is not yet complete. The process then repeats steps 1202-1208 until programming is complete.

In some embodiments a fast search for a leaky word line is performed. The leaky word line could be, for example, a word line to memory hole short, a word line to source line short, etc. In an embodiment, the exact word line that is involved in the short is located very rapidly using a divide and conquer search.

Figure 13:
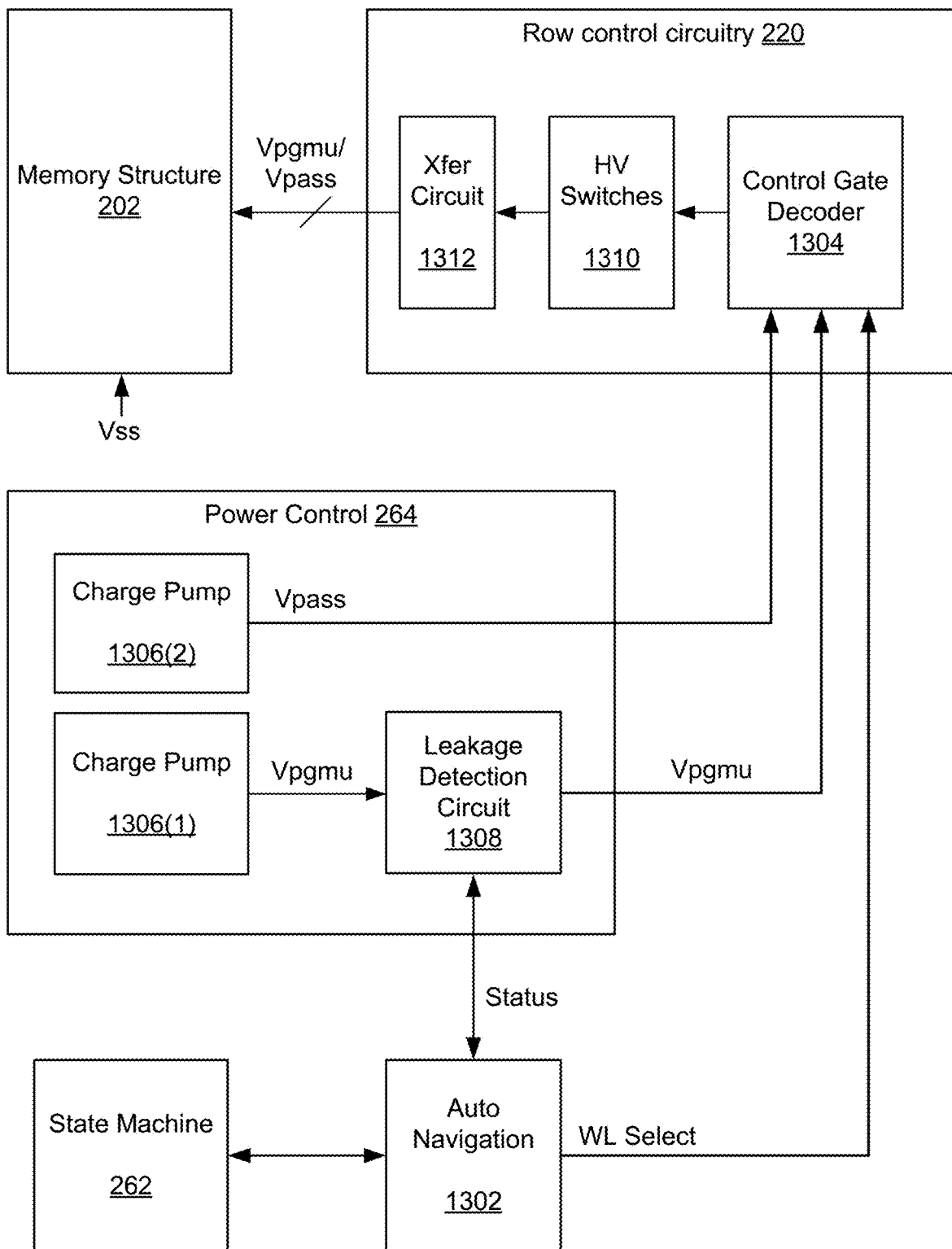
FIG. 13 is a block level diagram of one embodiment of components used in a fast search for a leaky word line.

FIG. 13 is a block level diagram of one embodiment of components used in a fast search for a leaky word line. The components in FIG. 13 are electrical circuits. The auto-navigation module 1302 controls the search for the leaky word line. The auto-navigation module 1302 controls which set of word lines are searched for a leaky word line. The word lines may be searched at different levels of granularity. For example, an entire block of word lines may be searched for a leaky word line, one tier of the block may be searched for a leaky word line, a specifically identified set of word lines may be searched for a leaky word line, or a specific word line may be tested whether it is a leaky word line. In one embodiment, the auto-navigation module 1302 performs a divide and conquer search for a leaky word line in which the word lines are repeatedly divided into smaller sub-groups with only selected smaller sub-groups tested for a short circuit until the leaky word line is located. Examples of divide and conquer searches include, but are not limited to, a binary search, a ternary search, and a quaternary search. However, divide and conquer searches are not limited to these examples. As will be described in more detail below it is not required that each step of the divide and conquer search divides the word lines into the same number of sub-groups. The auto-navigation module 1302 sends a WL select signal to the control gate decoder 1304 in order to control what set of one or more word lines are tested for being a leaky word line.

In one embodiment, the word lines that are tested for being leaky have a high voltage (e.g., Vpgmu) applied thereto and word lines that are not presently tested have a medium voltage (e.g., Vpass) applied thereto. A first charge pump 1306(1) generates the high voltage (e.g., Vpgmu) and provides that voltage to the leakage detection circuit 1308. As noted above, the magnitude of Vpgm may increase from one program loop to the next. The voltage Vpgmu may be the highest program voltage that would typically be used. However, Vpgmu could be even higher than the highest program voltage that would typically be used. Moreover, Vpgmu could be lower than the highest program voltage that would typically be used. A second charge pump 1306(2) generates the medium voltage (e.g., Vpass) and provide that voltage to the control gate decoder 1304. The voltage Vpass is a boosting voltage that is used during program. The leakage current detection circuit 1308 provides the high voltage (e.g., Vpgmu) to the control gate decoder 1304. The leakage current detection circuit 1308 is able to detect whether a leakage current results from application of the voltages to the memory structure 202.

The high-voltage (HV) switches 1310 may contain a high voltage switch (e.g., transistor) for each word line in a selected block in the memory structure 202. Based on the WL select signal from the auto-navigation 1302, the control gate decoder 1304 passes either the high voltage (e.g., Vpgmu) or the medium voltage (e.g., Vpass) to the appropriate HV switch. The HV switches 1310 pass these voltages to the transfer circuit 1312, which provides either the high voltage (e.g., Vpgmu) or the medium voltage (e.g., Vpass) to the appropriate word lines in the selected block. The transfer circuit 1312 may contain transistors that pass the voltages. In some embodiments, a low voltage (e.g., Vss or 0V) is applied to some region of the memory structure to set up a condition for a possible leakage current. For example, a low voltage (e.g., Vss) may be applied to the source line (by way of LI 499) in order to test for a word line to LI short circuit. As another example, a low voltage (e.g., Vss) may be to the bit lines and source line in order to test for a word line to memory hole short circuit. As noted above, the leakage current detection circuit 1308 is able to detect whether a leakage current results from application of the high and low voltages to the memory structure 202.

The auto-navigation module 1302 communicates with the leakage current detection circuit 1308 to instruct circuit 1308 to perform the leakage test and to receive status of the leakage detection test. The auto-navigation module 1302 may control the leakage test under direction of the state machine 262 and may report status to the state machine 262. In one embodiment, the auto-navigation module 1302 reports the address of the leaky word line. The auto-navigation module 1302 may be implemented in hardware (e.g., electrical circuits). In one embodiment, the auto-navigation module 1302 is programmable by software. In one embodiment, the auto-navigation module 1302 implemented by a micro-controller or microprocessor, either on or off the memory chip. The state machine 262 may report the address of the leaky word line to off-chip circuitry. The off-chip circuitry might be the memory controller 120 when the leakage test is performed in the field or test circuitry when the leakage test is performed in a factory.

FIG. 14 is a flowchart of one embodiment of a process 1400 for locating a leaky word line. In other words, the process 1400 looks for a word line that is involved in a short circuit. The short circuit may include, but is not limited to, a word line to memory hole short and a word line to source line short. Process 1400 may be performed in a BIST. The circuitry depicted in FIG. 13 may performed process 1400. In one embodiment, the die (e.g., memory die 200, control die 211) performs process 1400 in response to a command received on interface 268. The command could be provided by memory controller 120, but in some environments the memory controller 120 might not be present. For example, if process 1400 is performed in a test environment, then memory controller 120 might not be present.

Step 1402 includes selecting a group of word lines to test for a short circuit. In one embodiment, a block of NAND strings is selected. The block could have multiple tiers (see FIG. 4C, for example), but that is not required.

Step 1404 includes determining whether at least one word line in the group is involved in a short circuit. If none of the word lines in the group is involved in a short circuit (step 1406 is no short circuit), then the testing of this group of word lines may end. Then, in step 1410 the memory system determines whether to test another group of word lines. If so, the process returns to step 1402. However, if a leaky word line is detected (step 1406 is yes), then in step 1408 the leaky word line is searched for and located.

Step 1408 performs an efficient search for the leaky word line. In an embodiment, the system performs a divide and conquer search in which the group of the word lines is repeatedly divided into smaller sub-groups that are tested for the word line involved in the short circuit until the word line involved in the short circuit is located. After the leaky word line is located the address of the leaky word line may be reported. In one embodiment, the die (e.g., memory die 200, control die 211) reports the address of the leaky word line over, for example, interface 268.

Figure 15A:
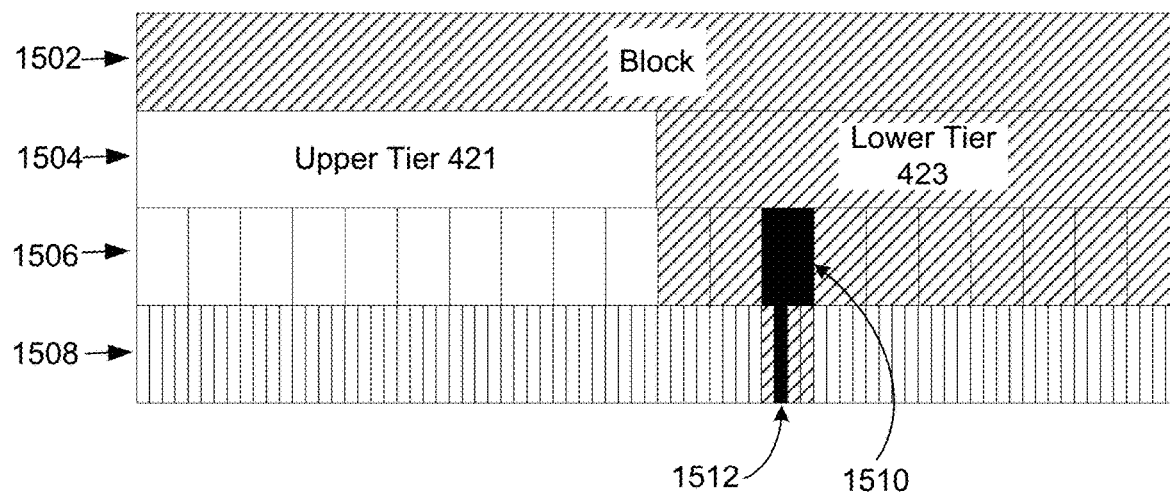
FIGS. 15A and 15B provide examples to illustrate a divide and conquer search for a leaky word line.
Figure 15B:
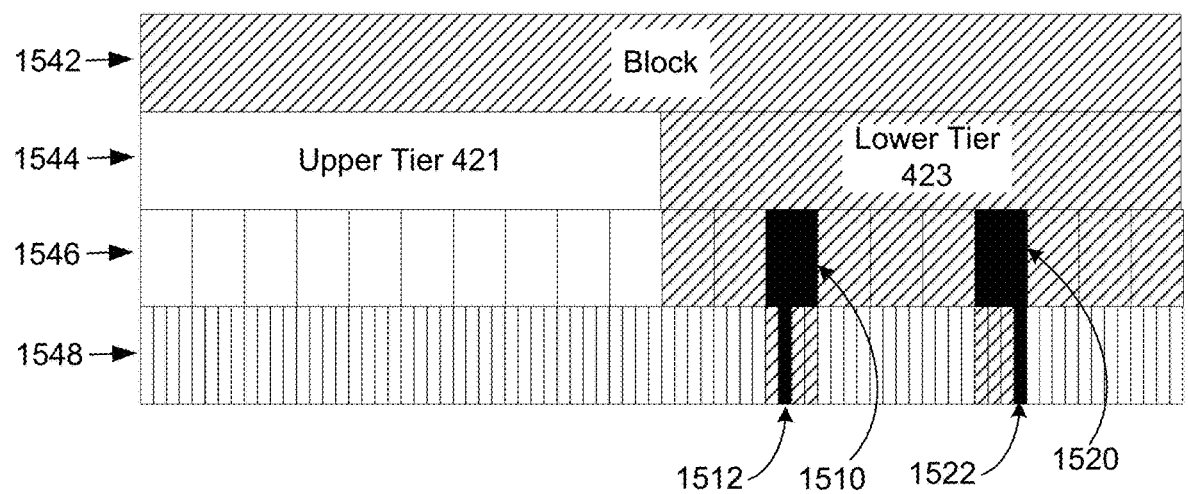

FIGS. 15A and 15B provide examples to illustrate a divide and conquer search for a leaky word line. The divide and conquer search has four steps 1502, 1504, 1506, and 1508 in this example. In step 1502, the entire block is searched for a leaky word line. The cross-hatching in FIG. 15A indicates that a leaky word line is present somewhere in the block. However, at step 1502 it is not known which word line is leaky. In an embodiment, step 1502 applies a test voltage to each word line in the block in a single test. Therefore, step 1502 quickly determines whether there is a leaky word line somewhere in the block.

In step 1504, the upper tier 421 and lower tier 423 of the selected block are tested separately for a leaky word line (see FIG. 4C for an example of upper tier 421 and lower tier 423). In the example, the test revealed that there is not a leaky word line in the upper tier 421. However, there is a leaky word line somewhere in the lower tier 423. Thus, in later steps only word lines in the lower tier 423 are tested.

In step 1506, multiple sub-groups of word lines in the lower tier 423 are tested. In FIG. 15A there are ten sub-groups depicted in the lower tier with one sub-group 1510 referenced by an arrow. Each of the ten sub-groups in the lower tier 423 may be tested. In this example, only sub-group 1510 has a leaky word line, as indicated by the black shading.

In step 1508, each individual word line in sub-group 1510 is tested for leakage. In this example, there are four word lines in sub-group 1510. Word line 1512 is shaded in black to indicate that it is the leaky word line.

FIG. 15B depicts a similar divide and conquer search for a leaky word line. However, in this example there are two leaky word lines 1512, 1522 in the block. Thus, in this example, the first two steps (1542, 1544) proceed as described above with respect to steps 1502 and 1504. However, in step 1546 two sub-groups 1510 and 1520 have leaky word lines. Leaky word line 1512 is found in step 1548 as described above in step 1508. However, leaky word line 1522 is also found in step 1548 by testing all word lines in sub-group 1520.

Thus, FIGS. 15A and 15B each depict an example of a divide and conquer search in which a block of word lines is repeatedly divided into smaller sub-groups that are tested for a leaky word line until the leaky word line is located. For example, in step 1504 the block is divided into a first sub-group of word lines in the upper tier 421 and second sub-group of word lines in the lower tier 423. In step 1506, the word lines of the lower tier 423 are divided into the 10 sub-groups in the lower tier 423. In step 1508, the word lines of the sub-group 510 are divided into the four sub-groups that each contain a single word line. Note that the sub-groups get smaller in each step in this divide and conquer search. In other words, the number of word lines per sub-group gets smaller with each step. The number of word lines in the sub-groups in each step can differ from the examples in FIGS. 15A and 15B. Also, the total number of steps in the divide and conquer search can be more or less than four. Also, note that in the examples in FIGS. 15A and 15B the block has 80 word lines. However, a block can have more or fewer than 80 word lines. However, 80 word lines is chosen for ease of illustration. In one embodiment, the block has 160 word lines and each tier is divided into 20 sub-groups in step 1506 (or 1546).

Note that in the examples of FIG. 15A, the term "group" may be used to describe the entire set of word lines in the block in step 1502. However, the term "sub-group" may be used for the units that are tested in each of steps 1504, 1506, and 1508, as each unit that is tested in step 1504, 1506, or 1508 is a "sub-group" of the group in step 1502. The terms "parent sub-group" and "child sub-groups" can also be used with the term "child sub-groups" referring to the entire set of sub-groups formed from one parent sub-group. For example, there are ten child sub-groups formed from the parent lower tier sub-group. Thus, each word line in the parent sub-group is in one of its child sub-groups. The terms parent and child can also be used to refer to moving from step 1506 to step 1508. For example, sub-group 1510 may be referred to as a parent sub-group having four child sub-groups (which in this case each have a single word line).

Figure 16:
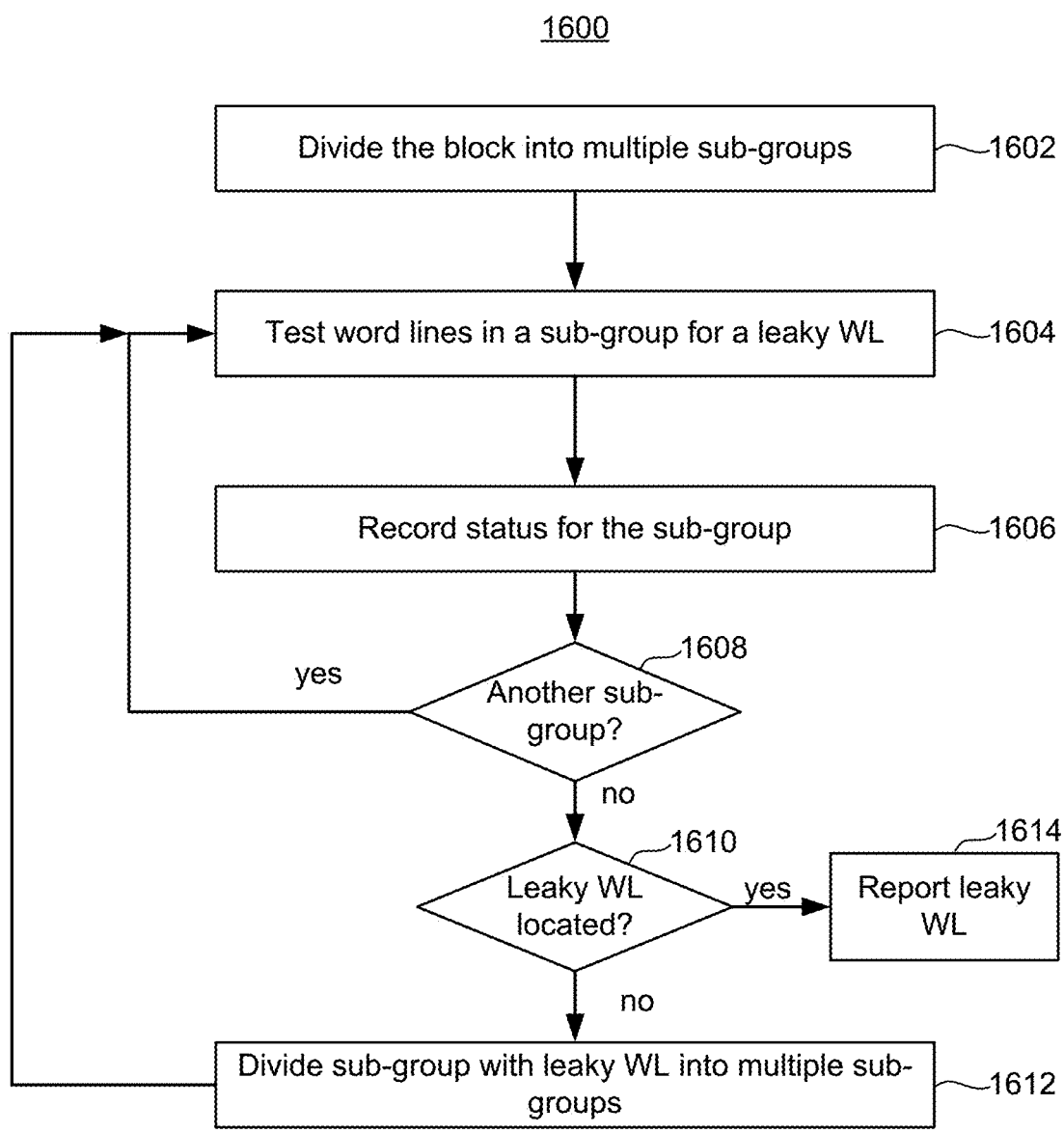
FIG. 16 is a flowchart of one embodiment of a process of repeatedly dividing a group of word lines into smaller sub-groups and testing selected smaller sub-groups for a short circuit until a word line involved in the short circuit is located.

FIG. 16 is a flowchart of one embodiment of a process 1600 of repeatedly dividing a group of word lines into smaller sub-groups and testing selected smaller sub-groups for a short circuit until a word line involved in the short circuit is located. Process 1600 provides further details for one embodiment of a divide and conquer search for a leaky word line that may be used in step 1408 of process 1400. Thus prior to process 1600 it has been determined that there is at least one leaky word line in the group (e.g., block) of word lines.

Step 1602 includes dividing the block having the leaky word line into multiple sub-groups of word lines. In the examples of FIGS. 15A and 15B the block is divided into the upper tier 421 and the lower tier 423, but that is just one example. The block may be divided into more than two sub-groups in step 1602.

In step 1604 one of the sub-groups is tested for a leaky WL. Further details of an embodiment of a test for a leaky word line are shown and described with respect to FIG. 18A. Referring now to step 1606 in FIG. 16, the status for this sub-group is recorded. The status could be recorded as a single bit that has one value for a leaky word line and another value for not a leaky word line. The status could be recorded in register, data latch, etc. Step 1608 includes a determination of whether there is another sub-group to test. In the example of FIG. 15A/15B, both tiers may be tested. When all of the sub-groups that were formed in step 1602 are tested, a determination is made in step 1610 whether the leaky word line has been located. Assuming that the leaky word line has not yet been located, then the sub-group having the leaky word line is divided into multiple sub-groups. With respect to the example in FIG. 15A, the lower tier 423 is divided into ten sub-groups. However, the lower tier 423 may be divided into more or fewer than ten sub-groups. The process 1600 then cycles through steps 1604-1608 to test each of these sub-groups for a leaky word line. Continuing with the example of FIG. 15A, step 1612 would be performed again to divide sub-group 1510 into multiple sub-groups (each having a single word line in this example). The process 1600 then cycles through steps 1604-1608 to test each of these word lines. The leaky word line 1512 would be reported in step 1614. The leaky word line 1512 may be reported by the state machine 262 efficiently by, for example, sending eight bits of information that report the status of eight word lines. A single bit can thus specify which word line is leaky. In one embodiment, the die (e.g., memory die 200, control die 211) reports the status of eight word lines each cycle for a number of cycles. Thus, the pass/fail status of each word line may be reported. In one embodiment, the die only reports the pass/fail status of certain word lines that are identified in a test command to the die.

Note that in the example of FIG. 15B, that step 1612 would also divide sub-group 1510 into multiple sub-groups in order to locate leaky word line 1522. Moreover, note that process 1600 is not limited to the examples in FIGS. 15A and 15B. Thus, the process 1600 is not limited to four steps (1502, 1504, 1506, 1508) is shown in FIG. 15A. Also, steps 1602 and 1612 of process 1600 are not limited to dividing the set of word lines having the leaky word line into any particular number of sub-groups to further test.

Figures 17A, 17B:
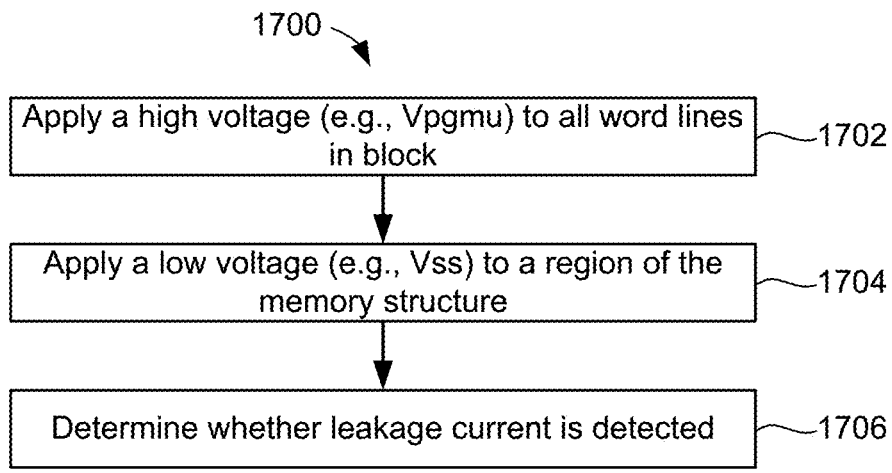
FIG. 17A is a flowchart of one embodiment of a process of determining whether a block of word lines contains a leaky word line.
FIG. 17B is a table that provides further details of voltages applied during an embodiment of the process of FIG. 17A.

FIG. 17A is a flowchart of one embodiment of a process 1700 of determining whether a block of word lines contains a leaky word line. The process 1700 may be used in one embodiment of 1404 in process 1400. Step 1702 includes applying a high voltage (e.g., Vpgmu) to all word lines in the block. Note that the program voltage used during program operations may vary depending on the program loop. The voltage Vpgmu may be the highest of these program voltages, or even higher than the highest program voltage typically used during a program operation. As one example, Vpgmu could be 25V. However, Vpgmu could be higher or lower than 25V. In one embodiment, auto-navigation module 1302 instructs the control gate decoder 1304 to apply the high voltage to all word lines in the block. Step 1704 includes applying a low voltage to a region of the memory structure. In one embodiment, the low voltage is applied to a source line in order to test for a word line to source line short. In one embodiment, the low voltage is applied to a bit line in order to test for a word line to memory hole short. In one embodiment, the low voltage is applied to both the bit line and the source line to test for either a word line to memory hole short or a word line to memory hole short. Step 1706 includes determining whether a leakage current is detected. In one embodiment, leakage current detection circuit 1308 monitors for a leakage current. In one embodiment, a leakage current may flow if there is a short circuit between any of the word lines in the block and the source line. In one embodiment, a leakage current may flow if there is a short circuit between any of the word lines in the block and the memory hole (e.g., the NAND string channel).

FIG. 17B is a table that provides further details of voltages applied during an embodiment of process 1700. A high voltage (e.g., Vpgmu) is applied to all of the data word lines in this example, but a lower voltage (e.g., Vpass) may be applied to all of the dummy word lines. The data word lines in FIG. 17B are WL0 to WL80 in the lower tier and WL81 to WL161 in the upper tier. The dummy word lines in FIG. 17B include one or more source side dummy WLs (DS), a dummy word line adjacent to the IF at the top of the lower tier (WLIFDL), a dummy word line adjacent to the IF at the bottom of the upper tier (WLIFDU), and one or more drain side dummy WLs (DD). A low voltage (e.g., Vss or 0V) is applied to both the bit lines (BL) and the source line (SL). The bit lines and the source line are examples of conductive lines connected to ends of the NAND strings. The voltage Vsgd applied to the one or more SGD line may be a select voltage that turns on the drain side select gates. The voltage Vsgs applied to the one or more SGS line may be a select voltage that turns on the source side select gates. In one embodiment, the voltages that are applied as depicted in FIG. 17B will result in a high voltage on the word lines and a low voltage on the NAND channel to test for a word line to memory hole short circuit. In one embodiment, the voltages that are applied as depicted in FIG. 17B will result in a high voltage on the word lines and a low voltage on the source line to test for a word line to LI short circuit.

FIG. 18A is a flowchart of one embodiment of a process 1800 of determining whether a sub-group of word lines contains a leaky word line. The process 1800 may be used in one embodiment of 1408 in process 1400. The process 1800 may be used in one embodiment of 1604 in process 1600. Step 1802 includes applying a high voltage (e.g., Vpgmu) to all word lines in the sub-group. This may be the same Vpmgu that is used in process 1700. In one embodiment, auto-navigation module 1302 instructs the control gate decoder 1304 to apply the high voltage to all word lines in the sub-group. Step 1804 includes applying a medium voltage (e.g., Vpass) to all word lines in the block that are not in the sub-group. For example, if it is sub-group 1510 (see FIG. 15A) that is being tested, then the high voltage is applied to only those word lines in sub-group 1510 with the medium voltage (e.g., Vpass) applied to all other word lines in the block. The medium voltage may be between the high voltage (e.g., Vpgmu) and the low (e.g., Vss), but it not required to be midway between the two. For example, Vpass may be approximately 8V, but could be higher or lower. Step 1806 includes applying a low voltage (e.g., Vss) to a region of the memory structure. In one embodiment, the low voltage is applied to a source line in order to test for a word line to source line short. In one embodiment, the low voltage is applied to a bit line in order to test for a word line to memory hole short. Step 1808 includes determining whether a leakage current is detected. In one embodiment, leakage current detection circuit 1308 monitors for a leakage current. In one embodiment, a leakage current may flow if there is a short circuit between any of the word lines in the sub-group and the source line. In one embodiment, a leakage current may flow if there is a short circuit between any of the word lines in the sub-group and the memory hole.

FIG. 18B is a table that provides further details of voltages applied during an embodiment of process 1800. The example in FIG. 18B has a single word line in the upper tier being tested (WLn). A high voltage (e.g., Vpgmu) is applied to just WLn. A medium voltage (Vpass) is applied to all other word lines (both data WLs and dummy WLs). A low voltage (e.g., Vss or 0V) is applied to both the bit line (BL) and the source line (SL). The voltage Vsgd applied to the one or more SGD line may be a select voltage that turns on the drain side select gates. The voltage Vsgs applied to the one or more SGS line may be a select voltage that turns on the source side select gates. In the event that more than one word line is being tested, then Vpgmu may be applied to those additional word lines being tested. In one embodiment, the word lines being tested are contiguous. That is, in one embodiment the group of word lines being tested at next to each other. For example, if four word lines are tested, those might be WL4, WL5, WL6, and WL7, which would each have Vpgmu applied thereto (with Vpass applied to all other word lines).

As described herein testing for a leaky word line can be performed at a variety of levels of granularity. FIG. 19 is a flowchart of one embodiment of a process 1900 of performing a leaky word line test in a specific set of word lines. In some embodiments, the state machine 262 will instruct the auto-navigation module 1302 as to which set of word lines should be tested for a leaky word line. However, the instruction as to which set of word lines to test could be sent to the die from off-chip. For example, either memory controller 120 or external test circuitry may send the die (e.g., memory die 200, control die 211) a set of instructions that request that certain word lines be tested.

Step 1902 includes receiving a request to test a set of one or more word lines for a leaky word line. Step 1904 is a branch with four branches depending on the scope of the test. One branch is to test all word lines in the block for a leaky word line. In step 1906 a high voltage (e.g., Vpgmu) is applied to all word lines in the block. Step 1906 may be similar to process 1700. In one embodiment, the status that is reported following step 1906 is simply whether there is a leaky word line somewhere in the block. Thus, it is not required that the leaky word line be located in step 1906.

A second branch is to test all word lines in one tier of block for a leaky word line. In step 1908 a high voltage (e.g., Vpgmu) is applied to all word lines in the tier. In step 1910 a medium voltage (e.g., Vpass) is applied to all word lines in the other tier(s) of the block. In one embodiment, the status that is reported following step 1910 is simply whether there is a leaky word line somewhere in the tier. Thus, it is not required that the leaky word line be located in this second branch.

A third branch is to test all word lines in one WL group of the block for a leaky word line. The WL group may be of any convenient size. For example, the WL group could include 4, 8, 12, 16 or some other number of word lines. In step 1912 a high voltage (e.g., Vpgmu) is applied to all word lines in the WL group. In step 1914 a medium voltage (e.g., Vpass) is applied to all other word lines in the block. In one embodiment, the status that is reported following step 1914 is simply whether there is a leaky word line somewhere in the WL group. Thus, it is not required that the leaky word line be located in this third branch.

A fourth branch is to test a single word lines in the block for a leaky word line. In step 1916 a high voltage (e.g., Vpgmu) is applied to the single word line. In step 1918 a medium voltage (e.g., Vpass) is applied to all other word lines in the block. In one embodiment, the status that is reported following step 1918 is whether the word line is leaky.

In view of the foregoing, a first embodiment includes an apparatus comprising a memory structure comprising non-volatile memory cells and one or more control circuits in communication with the memory structure. The one or more control circuits are configured to determine whether at least one word line in a group of word lines is involved in a short circuit. The one or more control circuits are configured to, responsive to a determination that at least one word line in the group is involved in a short circuit, repeatedly divide the group into smaller sub-groups of the word lines and test selected smaller sub-groups for a short circuit until a word line involved in the short circuit is located.

In a second embodiment, in furtherance to the first embodiment, the one or more control circuits are further configured to repeatedly divide parent sub-groups of the word lines into multiple child sub-groups, wherein each word line in each respective parent sub-group is in one of the child sub-groups of the respective parent sub-group. The one or more control circuits are further configured to select a child sub-group for testing for a short circuit responsive to a determination that the respective parent of the child contains at least one word line involved in a short circuit.

In a third embodiment, in furtherance to the first or second embodiments, the memory structure comprises multi-tier blocks each having an upper tier and a lower tier. The group of word lines comprises all data word lines in a selected block. A first child sub-group of the group of word lines comprises all data word lines in the upper tier in the selected block. A second child sub-group of the group of word lines comprises all data word lines in the lower tier in the selected block.

In a fourth embodiment, in furtherance to any of the second to third embodiments, the first child sub-group comprises a plurality of child sub-groups in the upper tier. The second child sub-group comprises a plurality of child sub-groups in the lower tier.

In a fifth embodiment, in furtherance the any of the second to fourth embodiment, each of the plurality of child sub-groups in the upper tier comprises child sub-groups each having a single word line. Each of the plurality of child sub-groups in the lower tier comprises child sub-groups each having a single word line.

In a sixth embodiment, in furtherance the any of the first to fifth embodiments, the one or more control circuits are further configured to apply a first voltage to all of the word lines in the group; apply a second voltage to a region of the memory structure, wherein the first voltage has a higher magnitude than the second voltage; and determine whether a leakage current results from the first voltage and the second voltage to determine whether at least one word line in the group is involved in a short circuit. Responsive to a determination that there is at least one word line in the group involved in a short circuit, for each respective sub-group the one or more control circuits are further configured to apply the first voltage to each word line in the respective smaller sub-group of the word lines; apply the second voltage to the region of the memory structure; apply a third voltage to all word lines in the group that are not in the respective sub-group, wherein the third voltage has a magnitude between the first voltage and the second voltage; and determine whether a leakage current results from the first voltage and the second voltage to determine whether there is at least one word line in the respective smaller sub-group involved in a short circuit.

In a seventh embodiment, in furtherance the sixth embodiment, the one or more control circuits are further configured to program the group using a program voltage applied to a selected word line and a boosting voltage applied to unselected word lines. The first voltage has a magnitude at least as great as the program voltage. The third voltage has a magnitude of approximately the boosting voltage.

In an eighth embodiment, in furtherance to any of the first to seventh embodiments, the one or more control circuits are further configured to output a pass/fail status for each word line in the group, including output a fail status for the word line involved in the short circuit.

In a ninth embodiment, in furtherance to the eighth embodiment, the pass/fail status for each word line is a single bit.

In a tenth embodiment, in furtherance to any of the first to eighth embodiments, the one or more control circuits are further configured to receive a request for a pass/fail status for a specifically identified set of the word lines in the group, and output a pass/fail status for each word line in the specifically identified set responsive to the request.

In an eleventh embodiment, in furtherance to any of the first to tenth embodiments, the short circuit comprises a word line to memory hole short circuit.

In a twelfth embodiment, in furtherance to any of the first to eleventh embodiments, the short circuit comprises a word line to source line short circuit.

One embodiment includes a method for locating a leaky word line in a memory structure comprising blocks having NAND strings. The method comprises applying a high voltage to all word lines in a selected block while applying a low voltage to another region memory structure, wherein the high voltage has a higher magnitude than the low voltage. The method comprises determining whether a leakage current results from applying the high voltage and the low voltage to determine whether there is a leaky word line in the selected block. The method comprises, responsive to a determination that there is a leaky word line in the selected block, repeatedly dividing the selected block of the word lines into smaller sub-groups and testing selected smaller sub-groups until the leaky word line is located including for each respective sub-group: applying the high voltage to each word line in the respective sub-group while applying the low voltage to the other region memory structure; applying a medium voltage to all word lines in the group that are not in the respective sub-group, wherein the medium voltage has a magnitude between the high voltage and the low voltage; and determining whether a leakage current results from the high voltage and the low voltage to determine whether there is a leaky word line in the respective sub-group.

One embodiment includes a non-volatile storage system, the system comprising a three-dimensional memory structure comprising blocks having word lines and NAND strings associated with the word lines. The non-volatile storage system also has means for determining whether a selected block has a leaky word line. The non-volatile storage system also has means for searching for the leaky word line in a series of steps in which for each step only word lines that are still potentially the leaky word line are divided into multiple smaller test groups until the leaky word line is located.

In an embodiment, the means for searching for the leaky word line in a series of steps in which for each step only word lines that are still potentially the leaky word line are divided into multiple smaller test groups until the leaky word line is located comprises one or more of state machine 262, auto-navigation module 1302, charge pumps 1306, leakage current detection circuit 1308, control gate decoder 1304, HV switches 1310, transfer circuit 1312, a processor, an FPGA, an ASIC, and/or an integrated circuit. In an embodiment, the means for searching for the leaky word line in a series of steps in which for each step only word lines that are still potentially the leaky word line are divided into multiple smaller test groups until the leaky word line is located performs the process 1600 in FIG. 16. In an embodiment, the means for searching for the leaky word line in a series of steps in which for each step only word lines that are still potentially the leaky word line are divided into multiple smaller test groups until the leaky word line is located performs the process 1800 in FIG. 18A.

In an embodiment, the means for determining whether a selected block has a leaky word line comprises one or more of state machine 262, auto-navigation module 1302, charge pumps 1306, leakage current detection circuit 1308, control gate decoder 1304, HV switches 1310, transfer circuit 1312, a processor, an FPGA, an ASIC, and/or an integrated circuit. In an embodiment, the means for determining whether a selected block has a leaky word line performs the process 1700 in FIG. 17A.

In an embodiment, the means for outputting an address of the leaky word line comprises one or more of state machine 262, auto-navigation module 1302, interface 268, a processor, an FPGA, an ASIC, and/or an integrated circuit.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via one or more intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus comprising:
a memory structure comprising non-volatile memory cells; and
one or more control circuits in communication with the memory structure, wherein the one or more control circuits are configured to:
determine whether at least one word line in a group of word lines is involved in a short circuit; and
responsive to a determination that at least one word line in the group is involved in a short circuit, repeatedly divide the group into smaller sub-groups of the word lines and test selected smaller sub-groups for a short circuit until a word line involved in the short circuit is located.

2. The apparatus of claim 1, wherein the one or more control circuits are further configured to:
repeatedly divide parent sub-groups of the word lines into multiple child sub-groups, wherein each word line in each respective parent sub-group is in one of the child sub-groups of the respective parent sub-group; and
select a child sub-group for testing for a short circuit responsive to a determination that the respective parent of the child contains at least one word line involved in a short circuit.

3. The apparatus of claim 2, wherein:
the memory structure comprises multi-tier blocks each having an upper tier and a lower tier;
the group of word lines comprises all data word lines in a selected block;
a first child sub-group of the group of word lines comprises all data word lines in the upper tier in the selected block; and
a second child sub-group of the group of word lines comprises all data word lines in the lower tier in the selected block.

4. The apparatus of claim 3, wherein:
the first child sub-group comprises a plurality of child sub-groups in the upper tier; and
the second child sub-group comprises a plurality of child sub-groups in the lower tier.

5. The apparatus of claim 4, wherein:
each of the plurality of child sub-groups in the upper tier comprises child sub-groups each having a single word line; and
each of the plurality of child sub-groups in the lower tier comprises child sub-groups each having a single word line.

6. The apparatus of claim 1, wherein the one or more control circuits are further configured to:
apply a first voltage to all of the word lines in the group;
apply a second voltage to a region of the memory structure, wherein the first voltage has a higher magnitude than the second voltage; and
determine whether a leakage current results from the first voltage and the second voltage to determine whether at least one word line in the group is involved in a short circuit;
responsive to a determination that there is at least one word line in the group involved in a short circuit, for each respective sub-group:
apply the first voltage to each word line in the respective smaller sub-group of the word lines;
apply the second voltage to the region of the memory structure;
apply a third voltage to all word lines in the group that are not in the respective sub-group, wherein the third voltage has a magnitude between the first voltage and the second voltage; and
determine whether a leakage current results from the first voltage and the second voltage to determine whether there is at least one word line in the respective smaller sub-group involved in a short circuit.

7. The apparatus of claim 6, wherein:
the one or more control circuits are further configured to program the group using a program voltage applied to a selected word line and a boosting voltage applied to unselected word lines;
the first voltage has a magnitude at least as great as the program voltage; and
the third voltage has a magnitude of approximately the boosting voltage.

8. The apparatus of claim 1, wherein the one or more control circuits are further configured to:
output a pass/fail status for each word line in the group, including output a fail status for the word line involved in the short circuit.

9. The apparatus of claim 8, wherein the pass/fail status for each word line is a single bit.

10. The apparatus of claim 1, wherein the one or more control circuits are further configured to:
receive a request for a pass/fail status for a specifically identified set of the word lines in the group; and
output a pass/fail status for each word line in the specifically identified set responsive to the request.

11. The apparatus of claim 1, wherein the short circuit comprises a word line to memory hole short circuit.

12. The apparatus of claim 1, wherein the short circuit comprises a word line to source line short circuit.

13. A method for locating a leaky word line in a memory structure comprising blocks having NAND strings, the method comprising:
applying a high voltage to all word lines in a selected block while applying a low voltage to another region memory structure, wherein the high voltage has a higher magnitude than the low voltage;
determining whether a leakage current results from applying the high voltage and the low voltage to determine whether there is a leaky word line in the selected block;
responsive to a determination that there is a leaky word line in the selected block, repeatedly dividing the selected block of the word lines into smaller sub-groups and testing selected smaller sub-groups until the leaky word line is located including for each respective sub-group:
applying the high voltage to each word line in the respective sub-group while applying the low voltage to the other region memory structure;
applying a medium voltage to all word lines in the group that are not in the respective sub-group, wherein the medium voltage has a magnitude between the high voltage and the low voltage; and determining whether a leakage current results from the high voltage and the low voltage to determine whether there is a leaky word line in the respective sub-group.

14. The method of claim 13, wherein the other region of the memory structure comprises a source line connected to a source end of the NAND strings in the selected block and bit lines connected to respective drain ends of the NAND strings in the selected block.

15. A non-volatile storage system, the system comprising:
a three-dimensional memory structure comprising blocks having word lines and NAND strings associated with the word lines;
means for determining whether a selected block has a leaky word line; and
means for searching for the leaky word line in a series of steps in which for each step only word lines that are still potentially the leaky word line are divided into multiple smaller test groups until the leaky word line is located.

16. The non-volatile storage system of claim 15, wherein:
each block includes an upper tier having upper tier word lines and a lower tier having lower tier word lines; and
the means for searching for the leaky word line in a series of steps is further for searching the upper tier word lines for the leaky word line and searching the lower tier word lines for the leaky word line.

17. The non-volatile storage system of claim 16, wherein the means for searching for the leaky word line in a series of steps is further for:
searching only sub-groups of word lines in the lower tier responsive to a determination that the leaky word line is in the lower tier but is not in the upper tier; and
searching only sub-groups of word lines in the upper tier responsive to a determination that the leaky word line is in the upper tier but is not in the lower tier.

18. The non-volatile storage system of claim 15, wherein the means for determining whether a selected block has a leaky word line is further for:
applying a high voltage to all data word lines in the selected block while applying a low voltage to conductive lines connected to ends of the NAND strings, wherein the high voltage has a magnitude greater than the low voltage; and
determining whether a leakage current results from applying the high voltage and the low voltage to determine whether the selected block has a leaky word line.

19. The non-volatile storage system of claim 18, wherein the means for searching for the leaky word line in a series of steps is further for:
repeatedly dividing the word lines into smaller sub-groups and testing selected smaller sub-groups until the leaky word line is located including for each respective sub-group:
applying the high voltage to each word line in the respective sub-group while applying the low voltage to the other region memory structure;
applying a medium voltage to all word lines in the selected block that are not in the respective sub-group, wherein the medium voltage has a magnitude between the high voltage and the low voltage; and
determining whether a leakage current results from applying the high voltage and the low voltage to determine whether there is a leaky word line in the respective sub-group.

20. The non-volatile storage system of claim 15, further comprising means for outputting an address of the leaky word line.

* * * * *